US012586641B2

(12) United States Patent
Kang

(10) Patent No.: US 12,586,641 B2
(45) Date of Patent: Mar. 24, 2026

(54) MEMORY DEVICE INCLUDING READ OFFSET COMPENSATOR AND OFFSET REFERENCE RESISTANCE COMPENSATION METHOD THEREOF

(71) Applicant: SAMSUNG ELECTRONICS CO., LTD., Suwon-si (KR)

(72) Inventor: Gyuseong Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 113 days.

(21) Appl. No.: 18/405,564

(22) Filed: Jan. 5, 2024

(65) Prior Publication Data

US 2024/0404597 A1 Dec. 5, 2024

(30) Foreign Application Priority Data

Jun. 1, 2023 (KR) ........................ 10-2023-0071125

(51) Int. Cl.
*G11C 13/00* (2006.01)
*G11C 29/52* (2006.01)
(52) U.S. Cl.
CPC ........ *G11C 13/0064* (2013.01); *G11C 13/004* (2013.01); *G11C 29/52* (2013.01); *G11C 2013/0054* (2013.01)
(58) Field of Classification Search
CPC ... G11C 13/0064; G11C 13/004; G11C 29/52; G11C 2013/0054
See application file for complete search history.

(56) References Cited

U.S. PATENT DOCUMENTS 6,807,101 B2 10/2004 Ooishi et al.
9,472,275 B2 10/2016 Park et al.
(Continued)

FOREIGN PATENT DOCUMENTS

JP 2015-115083 A 6/2015
KR 10-1793368 B1 11/2017
(Continued)

OTHER PUBLICATIONS

Nir, "Puzzle #2—Solution Adventures in ASIC Digital Design" Jul. 16, 2018 (1 page total).

(Continued)

*Primary Examiner* — Woo H Choi
(74) *Attorney, Agent, or Firm* — Sughrue Mion, PLLC

(57) ABSTRACT

A memory device includes a memory cell array including memory cells, a row decoder, a column decoder, a sense amplifier that reads data stored in a memory cell by detecting a difference between a source line voltage and a reference voltage during a read operation, and a control logic including a read offset compensator that receives output data from the sense amplifier and performs an offset reference resistance compensation operation. The read offset compensator compares a number of error bits of the output data with a threshold value, performs the offset reference resistance compensation operation based on a result of the comparison, calculates a local resistance for compensating an offset reference resistance for the sense amplifier during the offset reference resistance compensation operation, and adjusts a reference resistance for the sense amplifier based on the local resistance during the read operation.

19 Claims, 20 Drawing Sheets

(56)                      References Cited

U.S. PATENT DOCUMENTS

| | | | |
|---|---|---|---|
| 9,836,349 | B2 | 12/2017 | Lien et al. |
| 10,741,232 | B1 * | 8/2020 | Jabeur ................. G11C 11/1659 |
| 10,783,973 | B1 | 9/2020 | Lien et al. |
| 2013/0070519 | A1 * | 3/2013 | Lin ..................... G11C 11/1673 |
| | | | 365/158 |
| 2016/0078915 | A1 | 3/2016 | Katayama |
| 2017/0186472 | A1 | 6/2017 | Jan et al. |
| 2019/0198069 | A1 * | 6/2019 | Kale ..................... G11C 29/36 |
| 2019/0348096 | A1 | 11/2019 | Antonyan et al. |
| 2022/0051710 | A1 | 2/2022 | Kim |
| 2022/0172761 | A1 | 6/2022 | Endoh et al. |

FOREIGN PATENT DOCUMENTS

| | | | |
|---|---|---|---|
| KR | 10-2014916 | B1 | 8/2019 |
| KR | 10-2019-0130445 | A | 11/2019 |
| KR | 10-2188061 | B1 | 12/2020 |

OTHER PUBLICATIONS

Extended European Search Report dated Jul. 11, 2024, issued by the European Patent Office in European Application No. 24178172.3.
Yun et al., "MBIST Support for Reliable eMRAM Sensing", 2020 25th IEEE European Test Symposium (ETS), 2020, 6 total pages, doi:10.1109/ETS48528.2020.9131564.
Office Action dated Jul. 30, 2025, issued by European Patent Application No. 24178172.3.

* cited by examiner

| CMP_EN | DOUT<i> (i=1~n) | EXP_DATA | CNT_INC |
|---|---|---|---|
| 0 | X | X | 0 |
| 1 | 0 | 0 | 0 |
| 1 | 0 | 1 | 1 |
| 1 | 1 | 0 | 1 |
| 1 | 1 | 1 | 0 |

| DOUT<2> | DOUT<3> | DOUT<1> (carry in) | SUM | COUT (carry out) |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

MEMORY DEVICE INCLUDING READ OFFSET COMPENSATOR AND OFFSET REFERENCE RESISTANCE COMPENSATION METHOD THEREOF

CROSS-REFERENCE TO RELATED APPLICATION

This application claims priority under 35 U.S.C. § 119 to Korean Patent Application No. 10-2023-0071125 filed on Jun. 1, 2023, in the Korean Intellectual Property Office, the contents of which being incorporated by reference herein in its entirety.

BACKGROUND

Example embodiments consistent with the present disclosure relate to a semiconductor memory device, and more particularly, to a memory device including a read offset compensator and a method for compensating an offset reference resistance thereof.

A semiconductor memory may be mainly classified as a volatile memory or a non-volatile memory. Read and write speeds of the volatile memory (e.g., a DRAM or an SRAM) are fast, but the data stored in the volatile memory disappear when a power is turned off. In contrast, the non-volatile memory may retain data even when the power is turned off.

SUMMARY

It is an aspect to provide a memory device capable of increasing read margin through offset reference resistance compensation.

According to an aspect of one or more embodiments, there is provided a memory device comprising a memory cell array comprising a plurality of memory cells; a row decoder connected to the memory cell array through word lines; a column decoder connected to the memory cell array through bit lines and source lines; a sense amplifier configured to read data stored in a memory cell by detecting a difference between a source line voltage and a reference voltage during a read operation; and a control logic comprising a read offset compensator that receives output data from the sense amplifier and performs an offset reference resistance compensation operation, wherein the read offset compensator compares a number of error bits of the output data with a threshold value, performs the offset reference resistance compensation operation based on a result of the comparison, calculates a local resistance for compensating an offset reference resistance for the sense amplifier during the offset reference resistance compensation operation, and adjusts a reference resistance for the sense amplifier based on the local resistance during the read operation.

According to an aspect of one or more embodiments, there is provided a read offset compensator of a memory device, the read offset compensator comprising an error detector configured to determine whether a number of error bits of output data input from a plurality of sense amplifiers of the memory device is greater than a threshold value and output a compensation enable signal based on a result of the determination; an offset reference resistance generator configured to generate an offset reference resistance; and a plurality of sense amplifier offset compensators corresponding respectively to the plurality of sense amplifiers, each of the plurality of sense amplifier offset compensators configured to receive output data from a corresponding one of the plurality of sense amplifiers, compare the output data with expected data, and adjust the offset reference resistance for the sense amplifier based on a result of the comparison; wherein each of the plurality of sense amplifier offset compensators calculates a local resistance for compensating the offset reference resistance for a corresponding one of the plurality of sense amplifiers during an offset reference resistance compensation operation, and, during a read operation, adjusts a reference resistance for the corresponding one of the plurality of sense amplifiers based on the local resistance.

According to an aspect of one or more embodiments, there is provided a method for compensating offset reference resistance of a memory device, the method comprising writing a plurality of memory cells of the memory device with the same data; reading output data of a plurality of sense amplifiers; determining whether a number of error bits of the output data from the plurality of sense amplifiers is greater than a threshold value, and outputting a compensation enable signal based on a result of the determining; and calculating a local resistance for each of the plurality of sense amplifiers based on the compensation enable signal, and compensating for an offset reference resistance using the local resistance, wherein, during a read operation, the memory device adjusts a reference resistance based on the local resistance.

BRIEF DESCRIPTION OF THE FIGURES

The above and other aspects will become apparent by describing in detail embodiments thereof with reference to the accompanying drawings.

FIG. 7 is a block diagram illustrating a read offset compensator of the memory device shown in FIG. 2, according to an example embodiment.

FIG. 10 is a diagram for explaining a logical operation result of the decision logic shown in FIG. 9, according to an example embodiment.

FIGS. 11 and 12 are block diagrams illustrating an error detector of the first sense amplifier offset compensator shown in FIG. 8, according to an example embodiment.

FIGS. 13 to 15 are circuit diagrams and charts illustrating an example in which the error detector shown in FIG. 12 detects a 2-bit error, according to some example embodiments.

FIG. 16 is a circuit diagram illustrating an example in which the error detector receives first to tenth output data, according to an example embodiment.

FIG. 17 is a circuit diagram illustrating an example of a third OR gate of the circuit diagram shown in FIG. 16, according to an example embodiment.

3

Figure 8:
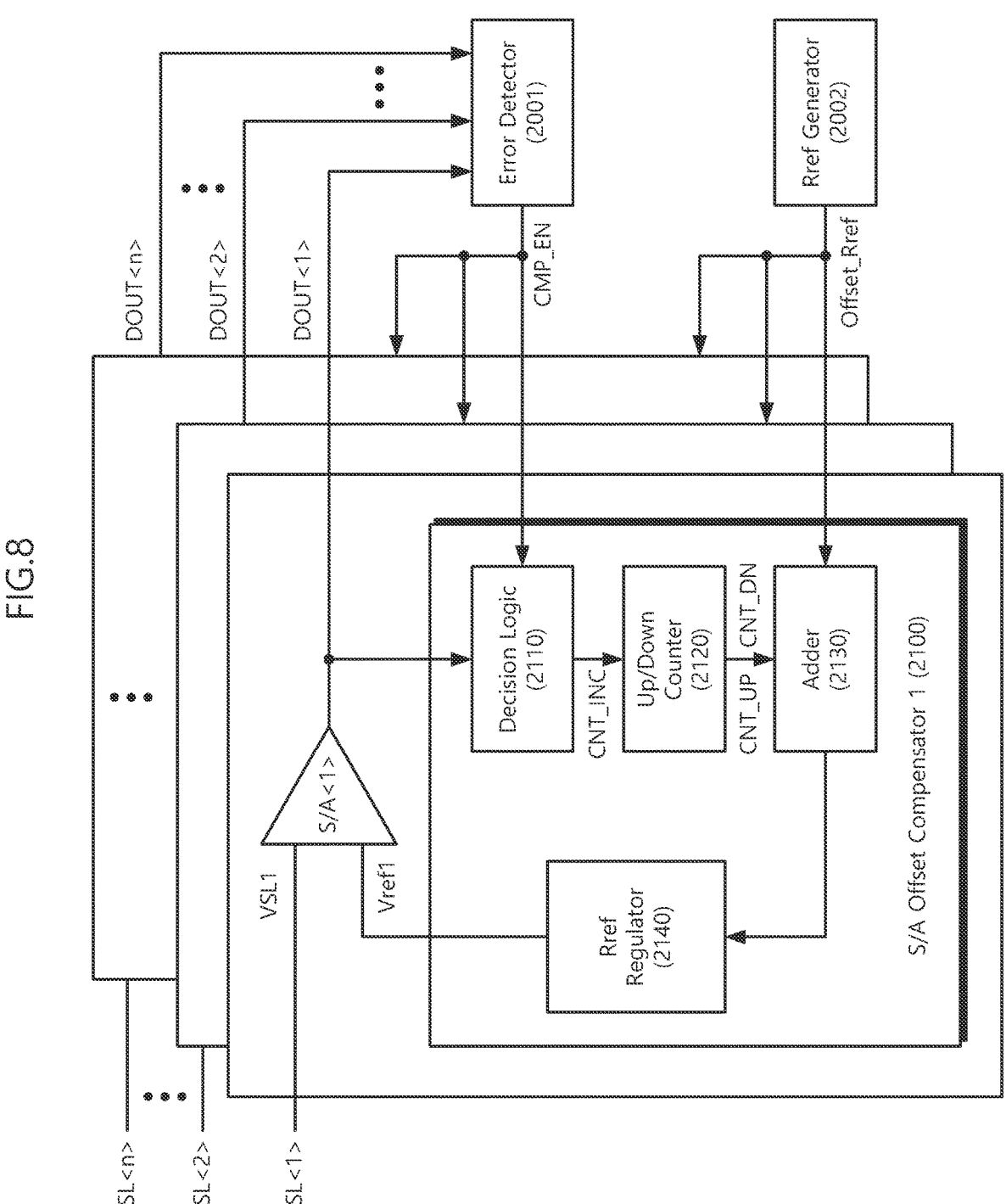
FIG. 8 is a block diagram illustrating a first sense amplifier offset compensator of the read offset compensator shown in FIG. 7, according to an example embodiment.
Figure 18:
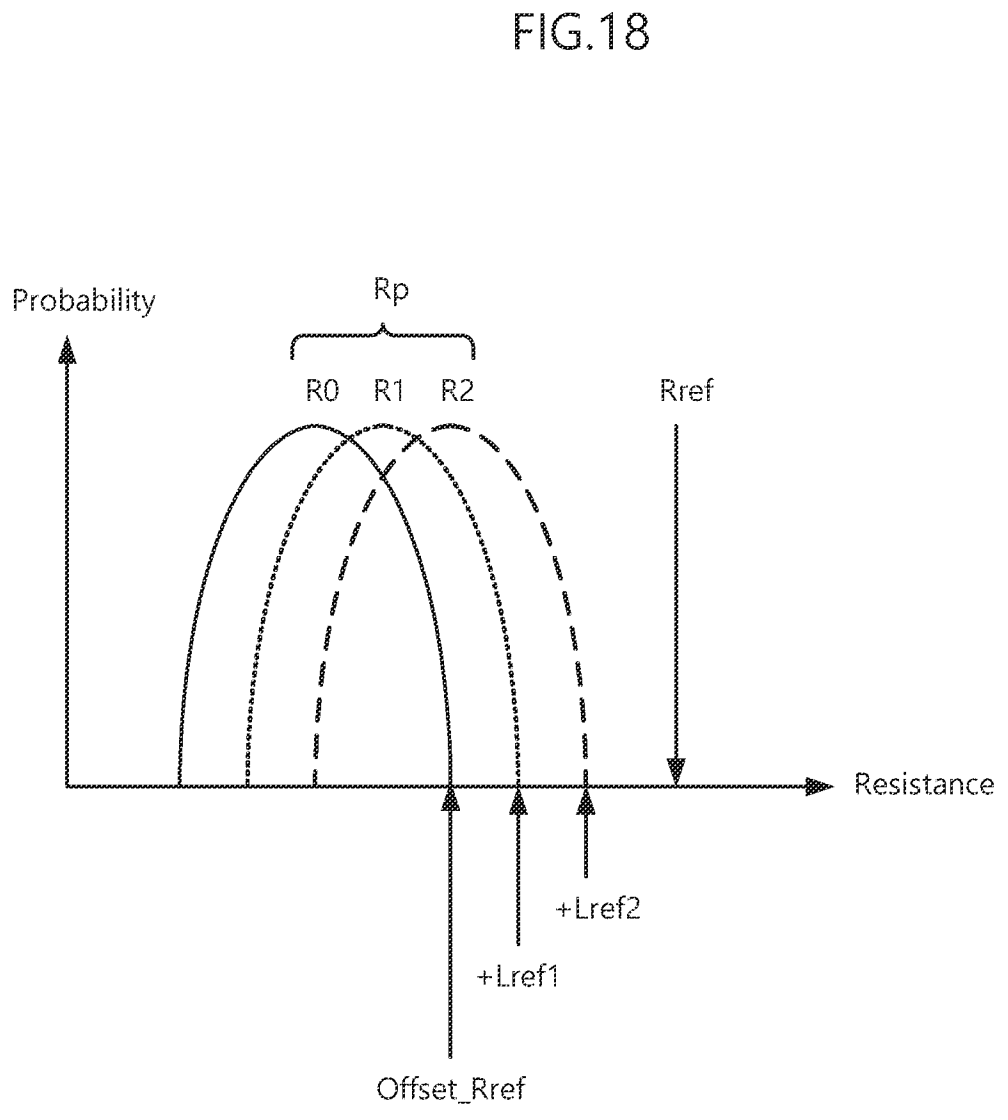

FIG. 18 is a graph for explaining offset reference resistance generated by an offset reference resistance generator of the first sense amplifier offset compensator shown in FIG. 8, according to an example embodiment.

Figure 19:
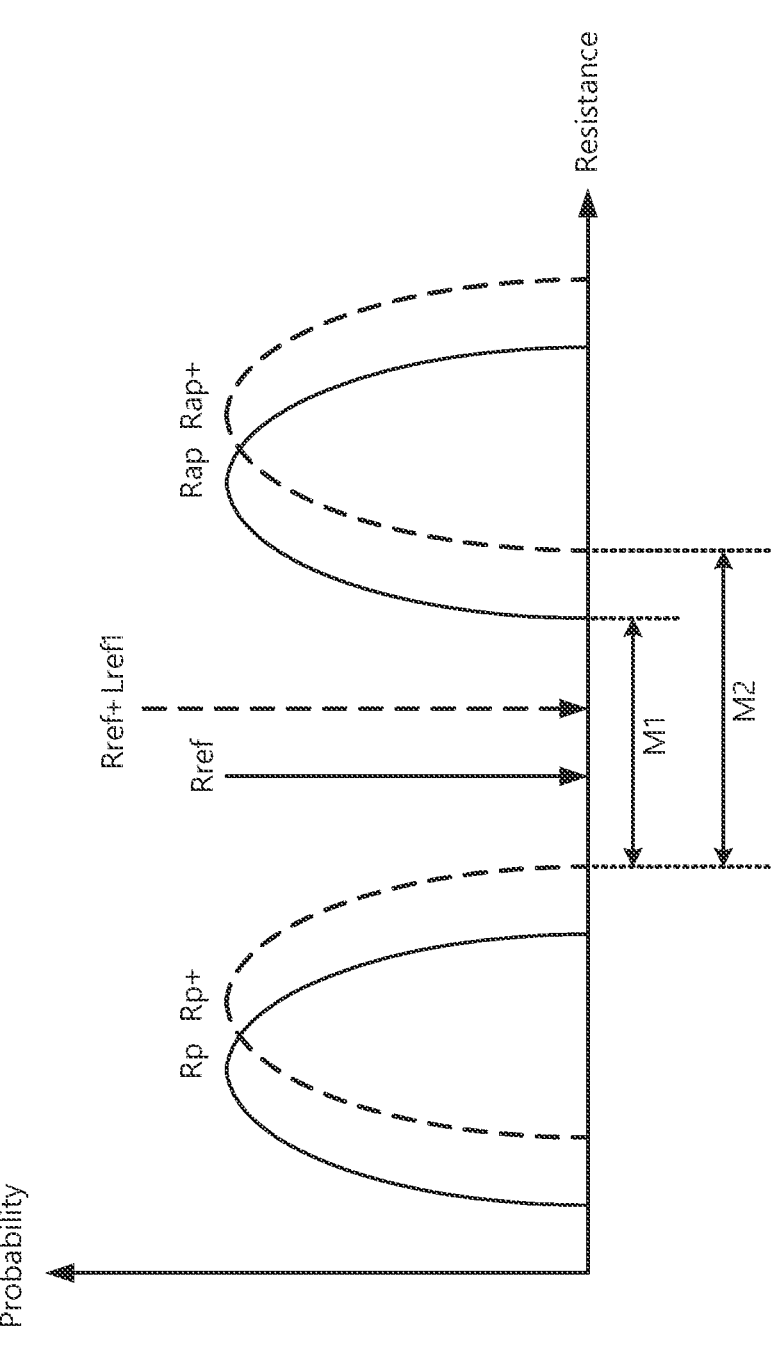

FIG. 19 is a graph for explaining a read margin before and after compensating for an offset reference resistance, according to an example embodiment.

Figure 20:
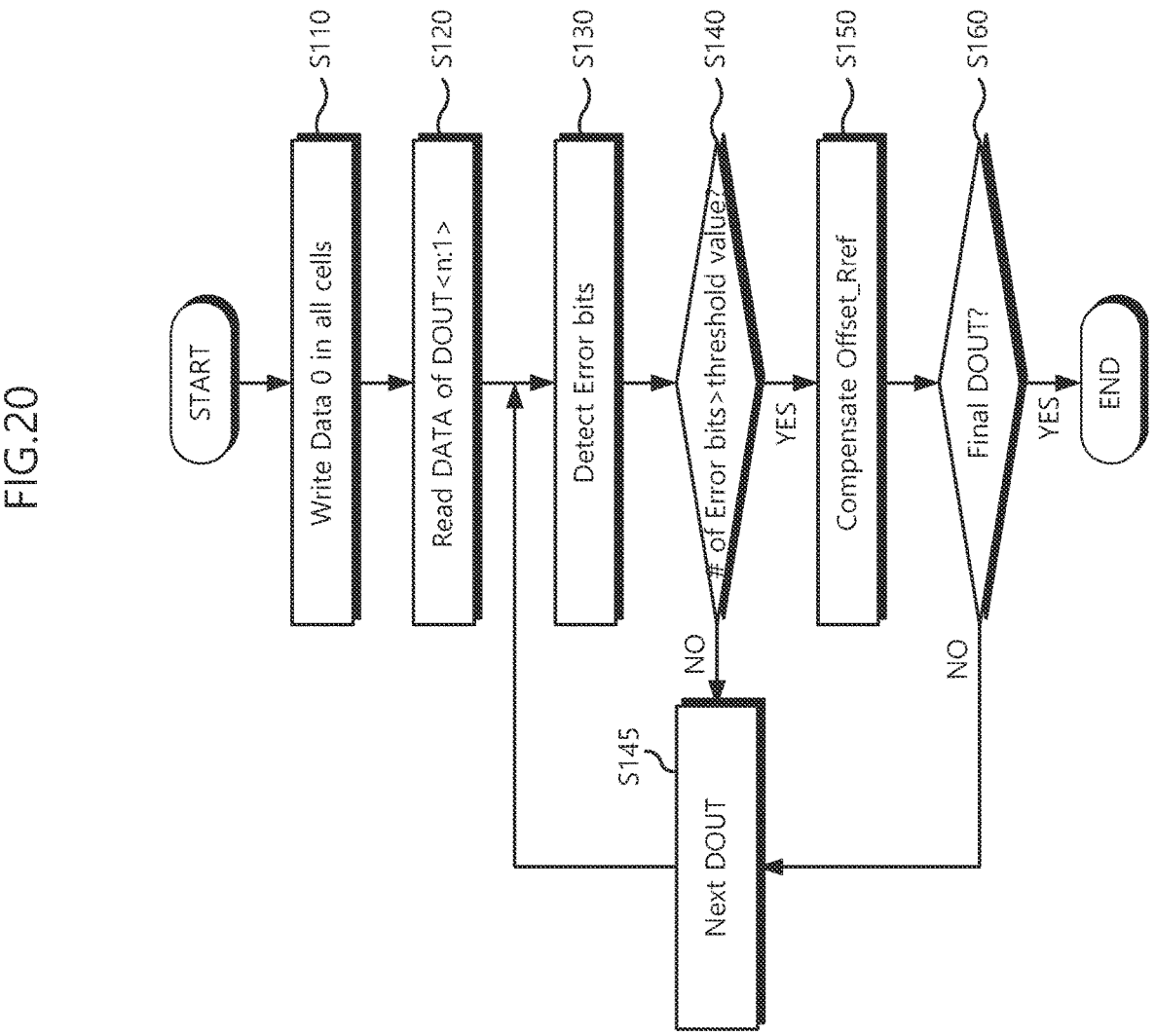

FIG. 20 is a flowchart illustrating an offset reference resistance compensating operation of a memory device according to an example embodiment.

DETAILED DESCRIPTION

A magnetoresistive random access memory (MRAM) may include a magnetic tunnel junction (MTJ). The magnetization direction of the MTJ may change according to the direction of the current applied to the MTJ. The resistance value of the MTJ may vary according to the magnetization direction of the MTJ. The MRAM may store or read data using these MTJ characteristics.

The MRAM may perform a read operation by comparing a resistance distribution R0 with data 0 and a reference resistance Rref having an intermediate size between a resistance distribution R1 with data 1. However, the resistance distribution of the MRAM may be different for each input/output terminal (I/O) due to mismatches such as MTJ resistance or sense amplifier resistance. There is a disadvantage in that, if the resistance distribution of the MRAM changes, the read margin for the read operation may decrease.

Below, various example embodiments will be described in detail and clearly to such an extent that one of ordinary skill in the art may easily implement the various example embodiments.

Figure 1:
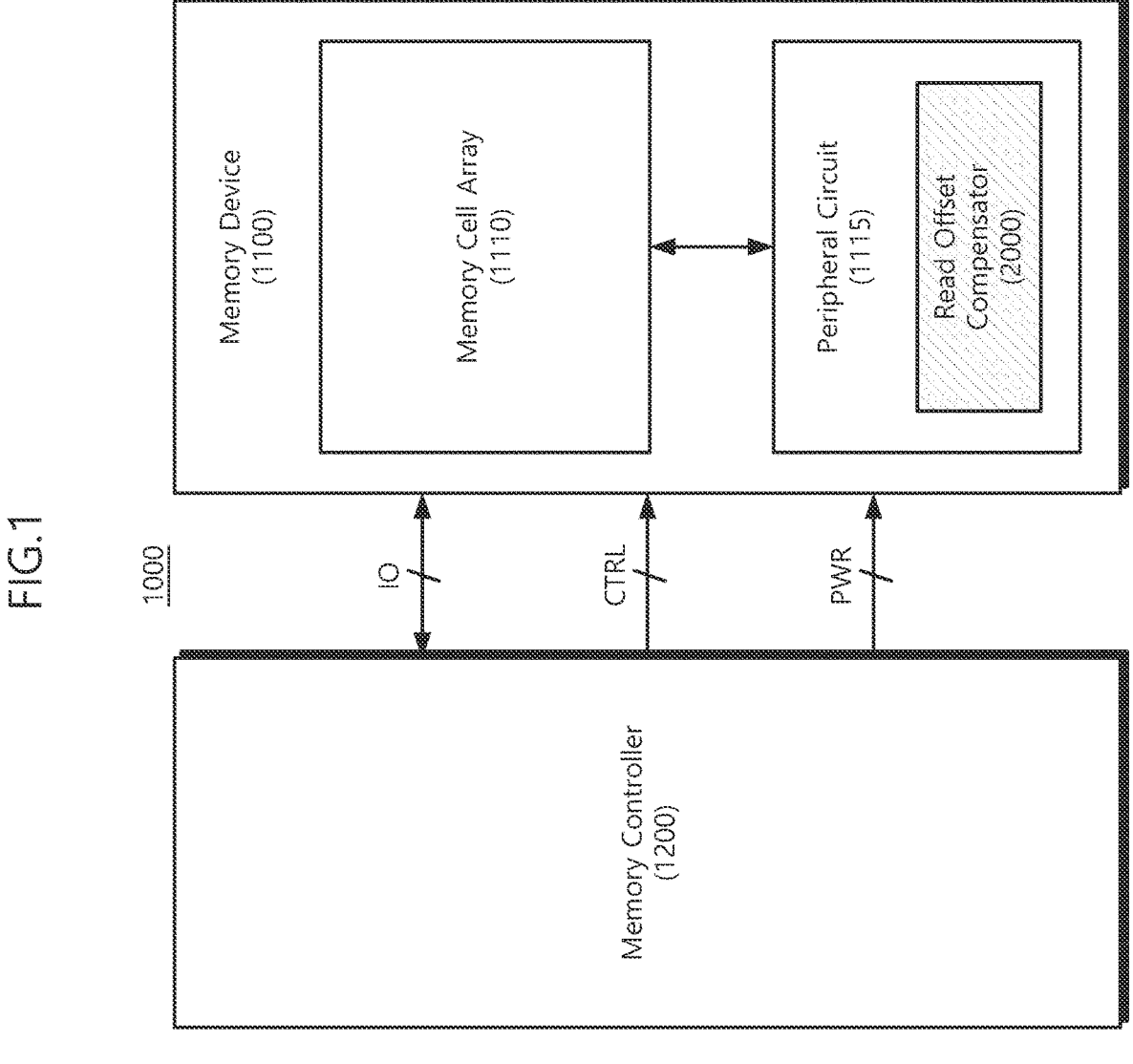
FIG. 1 is a block diagram illustrating a storage device according to an example embodiment.

FIG. 1 is a block diagram illustrating a storage device according to an example embodiment. A storage device 1000 may be a flash storage device based on a flash memory. For example, the storage device 1000 may be implemented as a solid-state drive (SSD), a universal flash storage (UFS), a memory card, or the like.

Referring to FIG. 1, the storage device 1000 may include a memory device 1100 and a memory controller 1200. The memory device 1100 may receive input/output signals IO from the memory controller 1200 through input/output lines, receive control signals CTRL through control lines, and receive external power supply PWR through power lines. The storage device 1000 may store data in the memory device 1100 under the control of the memory controller 1200.

The memory device 1100 may include a memory cell array 1110 and a peripheral circuit 1115. The memory cell array 1110 may include a plurality of memory blocks BLK1 to BLKn (see FIG. 2). Each memory block may have a vertical 3D structure. Each memory block may include a plurality of memory cells. Multi-bit data may be stored in each memory cell.

The memory cell array 1110 may be located (e.g., disposed) next to or above the peripheral circuit 1115 in terms of the design layout structure. A structure in which the memory cell array 1110 is positioned over the peripheral circuit 1115 may be referred to as a cell on peripheral (COP) structure.

In an example embodiment, the memory cell array 1110 may be manufactured as a chip separate from the peripheral circuit 1115. An upper chip including the memory cell array 1110 and a lower chip including the peripheral circuit 1115 may be connected to each other by a bonding method. Such a structure may be referred to as a chip-to-chip (C2C) structure.

The peripheral circuit 1115 may include analog circuits and/or digital circuits required to store data in the memory cell array 1110 or read data stored in the memory cell array 1110. The peripheral circuit 1115 may receive the external power PWR through power lines and generate internal powers of various levels.

The peripheral circuit 1115 may receive commands, addresses, and/or data from the memory controller 1200 through the input/output lines. That is, the input/output signals IO may include commands, addresses, and/or data. In some example embodiments, the peripheral circuit 1115 may store data in the memory cell array 1110 according to the control signals CTRL. In some example embodiments, the peripheral circuit 1115 may read data stored in the memory cell array 1110 and provide the read data to the memory controller 1200.

The peripheral circuit 1115 may include a read offset compensator 2000. The read offset compensator 2000 may determine whether the number of error bits of output data is greater than a threshold value, and perform an offset reference resistance compensation operation according to the determination result. The memory device 1100 may improve a read margin during a normal read operation through an offset reference resistance compensation operation. The read offset compensator 2000 will be described in more detail below.

Figure 2:
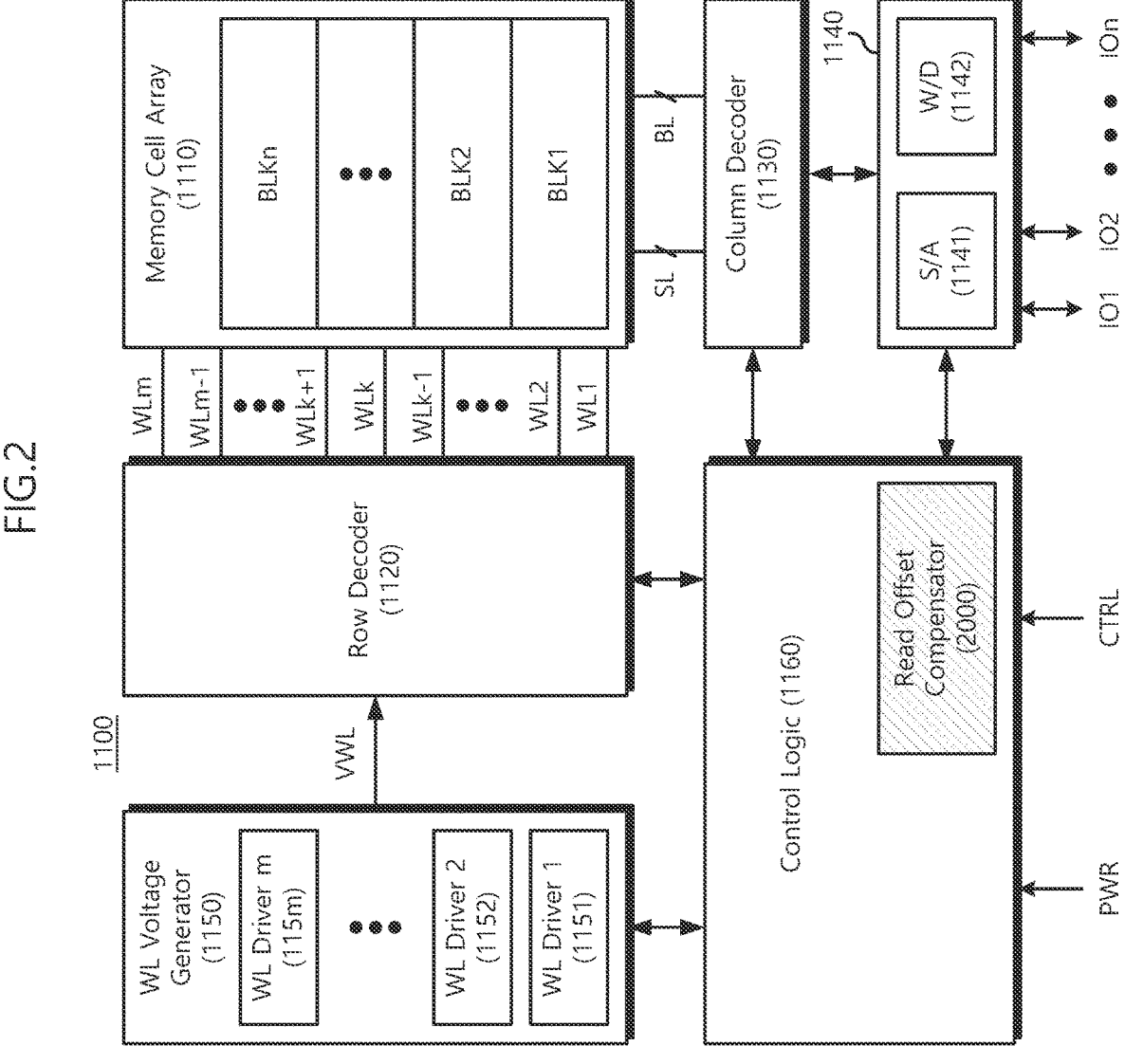
FIG. 2 is a block diagram illustrating a memory device of the storage device shown in FIG. 1, according to an example embodiment.

FIG. 2 is a block diagram illustrating in more detail the memory device 1100 shown in FIG. 1, according to an example embodiment. The storage device 1000 of FIG. 1 may be a resistive storage device based on a resistive memory. For example, the memory device 1100 may be MRAM, ReRAM, or PRAM.

Referring to FIGS. 1 and 2, the memory device 1100 may include the memory cell array 1110 and the peripheral circuit 1115. The peripheral circuit 1115 may include a row decoder 1120, a column decoder 1130, an input/output circuit 1140, a word line (WL) voltage generator 1150, and a control logic 1160.

The memory cell array 1110 may include the plurality of memory blocks BLK1 to BLKn. Each memory block may include a plurality of memory cells. Each memory cell may store multi-bit data. Each memory block (e.g., BLK1) may be connected to a plurality of word lines WL1 to WLm.

The row decoder 1120 may be connected to the memory cell array 1110 through a plurality of word lines WL1 to WLm. The row decoder 1120 may select a word line during a program or read operation. The row decoder 1120 may receive the word line voltage VWL from the word line voltage generator 1150 and provide the word line voltage VWL for a program or read operation to a selected word line.

The column decoder 1130 may be connected to the memory cell array 1110 through source lines SL and/or bit lines BL. The column decoder 1130 may select source lines SL and/or bit lines BL in response to a selection signal provided from the control logic 1160. The column decoder 1130 may select source lines SL and/or bit lines BL using a plurality of NMOS transistors (not shown).

The input/output circuit 1140 may be internally connected to the column decoder 1130 through data lines and externally connected to the memory controller 1200 (refer to FIG. 1) through the input/output lines IO1 to IOn. The input/output circuit 1140 may receive program data from the memory controller 1200 during a program operation. The input/output circuit 1140 may provide data read from the memory cell array 1110 to the memory controller 1200 during a read operation.

The input/output circuit 1140 may include a sense amplifier (S/A) 1141 and a write driver (W/D) 1142. The input/output circuit 1140 may receive or output data from input/output terminals. The number of input/output terminals may vary depending on the type of storage device 1000. The input/output circuit 1140 may provide data to the write driver 1142 in response to a control signal or output data provided from the sense amplifier 1141 to the outside.

The sense amplifier (S/A) 1141 may read data stored in the selected memory cell by sensing a difference between the voltage of the source line SL and a reference voltage Vref during a read operation. The reference voltage Vref may be provided by a reference voltage generator circuit (not shown). The sense amplifier 1141 may operate in response to a control signal provided from the control logic 1160.

The write driver (W/D) 1142 may receive a control signal from the control logic 1160 and provide a program current to a data line. The program current may be for programming the selected memory cell into one of multi-states. During a multi-level cell program operation, the write driver 1142 may provide the program current one or more times according to the multi-state of the selected memory cell.

The word line (WL) voltage generator 1150 may receive internal power from the control logic 1160 and generate a word line voltage VWL required to read or write data. The word line voltage VWL may be provided to the selected word line sWL through the row decoder 1120. The word line voltage generator 1150 may include a plurality of word line (WL) drivers 1151 to 115$m$.

The control logic 1160 may control read and/or write operations of the memory device 1100 using commands CMD, addresses ADDR, and control signals CTRL provided from the memory controller 1200. The addresses ADDR may include a row address for selecting one memory block or one word line and a column address for selecting one memory cell.

The control logic 1160 may include the read offset compensator 2000. The read offset compensator 2000 may determine whether the number of error bits of output data is greater than a threshold value, and perform an offset reference resistance compensation according to the determination result. The read offset compensator 2000 may compensate a reference resistance Rref as much as a local resistance. The local resistance may be calculated during an offset reference resistance compensation operation. According to an example embodiment, the memory device 1100 may be calibrated to have the local resistance for compensating an offset reference resistance individually for each sense amplifier. Accordingly, the memory device 1100 may improve read margin during a read operation.

Figure 3:
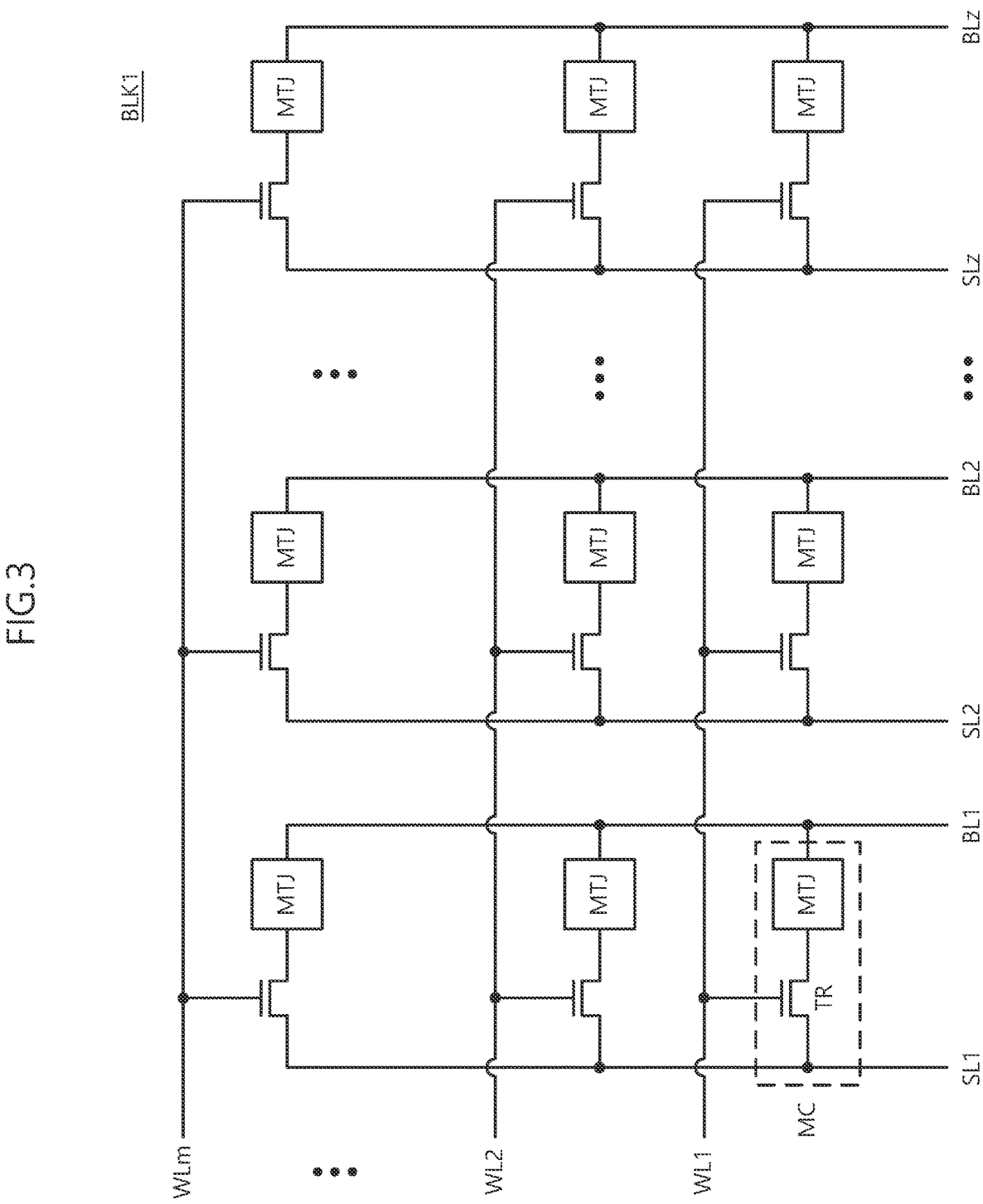
FIG. 3 is a diagram illustrating a memory block of a memory cell array of the storage device of FIG. 1, according to an example embodiment.
Figure 4:
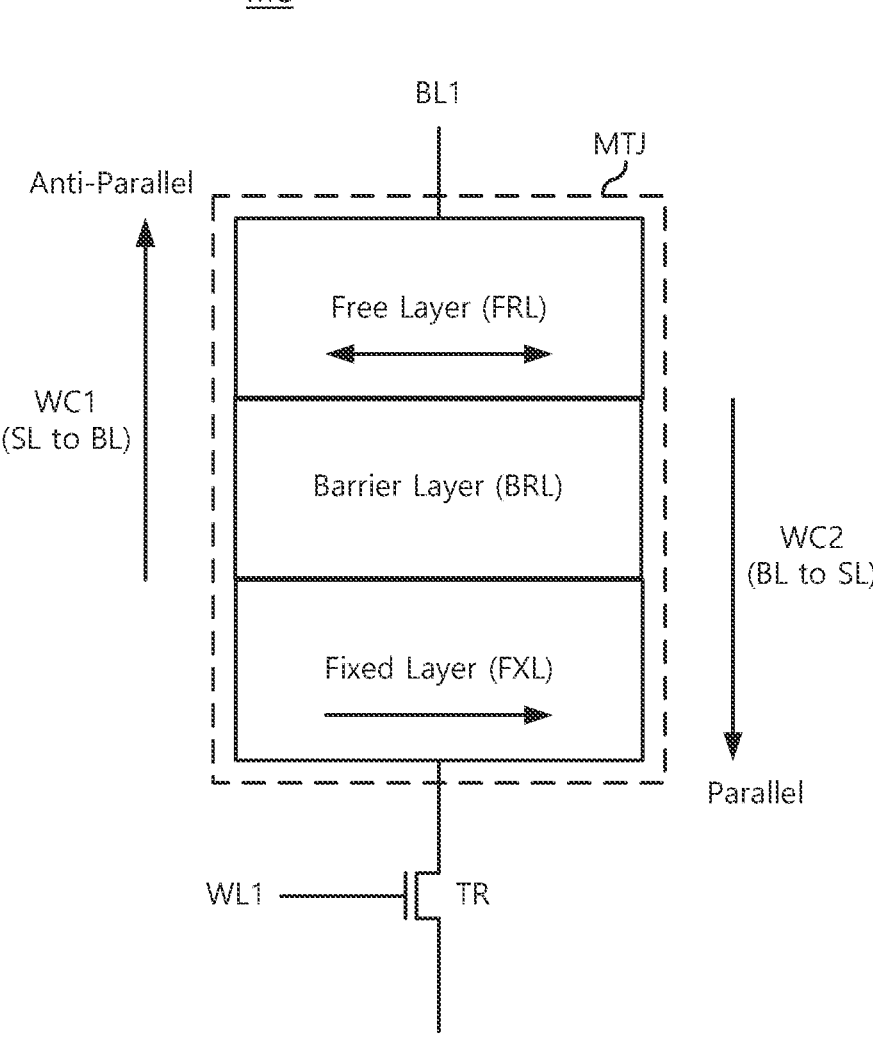
FIGS. 4 to 6 are diagrams for describing a first memory cell of the memory block of FIG. 3, according to some example embodiments.
Figure 5:
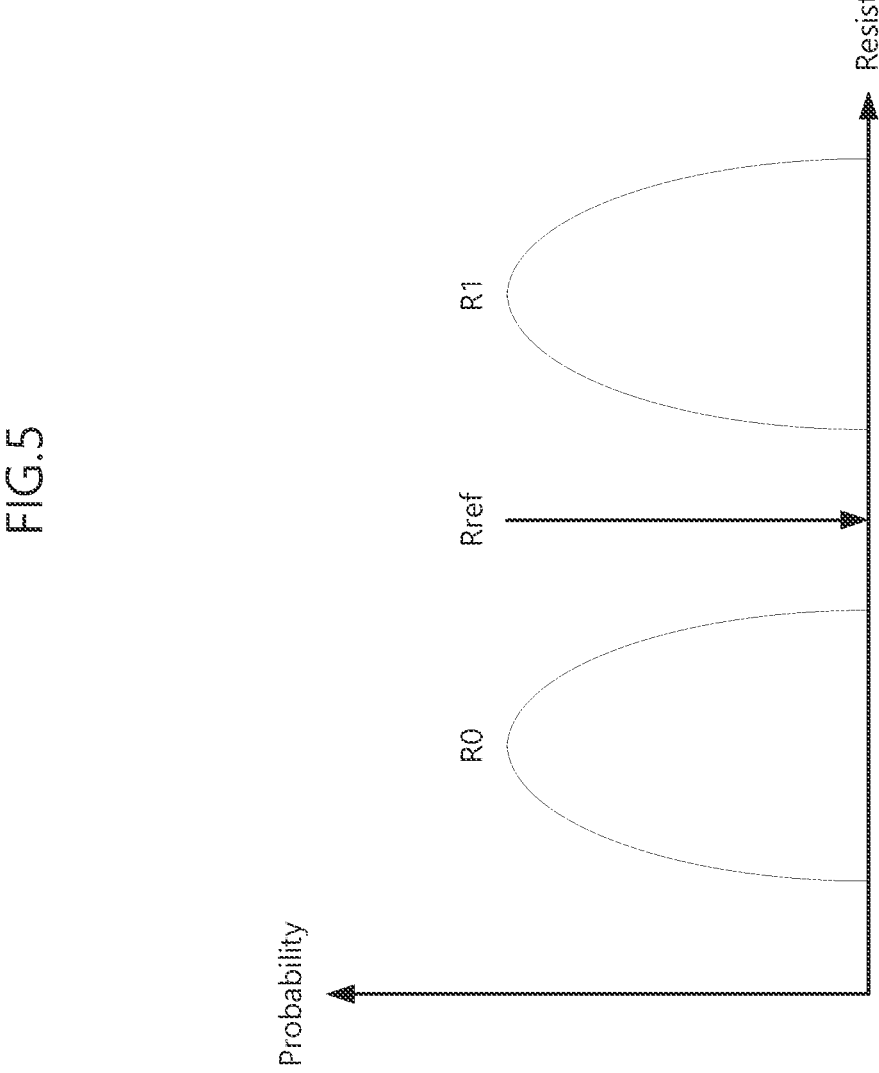
Figure 6:
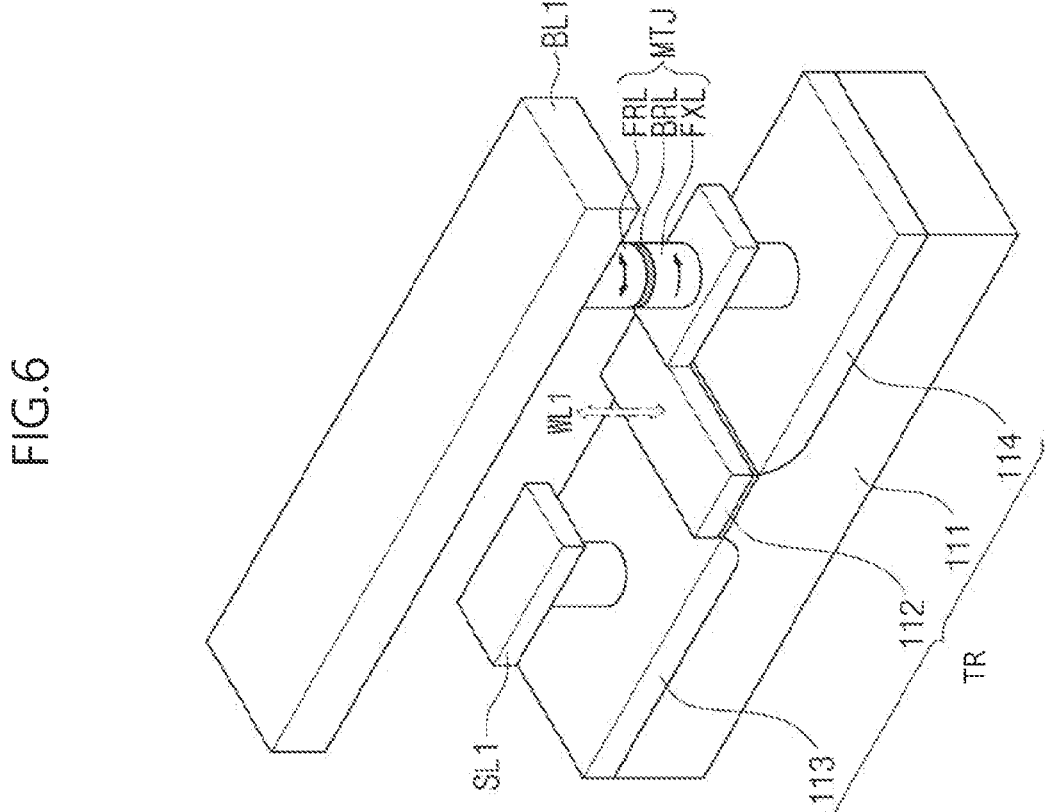

FIG. 3 is a diagram illustrating a memory block BLK1 of the memory cell array 1110 of FIG. 1, according to an example embodiment. FIGS. 4 to 6 are diagrams for describing a first memory cell the memory block of FIG. 3, according to some example embodiments. The memory blocks BLK1 to BLKn each have similar structures and functions and thus, it will be understood that the description of BLK1 also applies to BLK2 to BLKn and repeated description thereof is omitted for conciseness.

Referring to FIGS. 3 to 6, the memory cell array 1100 may include a plurality of memory cells MC. Each of the plurality of memory cells MC may be an MRAM cell, and the plurality of memory cells may be connected with word lines WL1 to WLm, bit lines BL1 to BLn, and source lines SL1 to SLn. The plurality of memory cells MC each have similar structures and functions and thus, it will be understood that the description of memory cell MC also applies to other memory cells of the plurality of memory cells MC and repeated description thereof is omitted for conciseness.

For example, a memory cell MC may include an access transistor TR and a variable resistance element MTJ (e.g., a magnetic tunnel junction). A first end of the access transistor TR may be connected with the first source line SL1, a second end of the access transistor TR may be connected with a first end of the variable resistance element MTJ, and a gate of the access transistor TR may be connected with the first word line WL1. A second end of the variable resistance element MTJ may be connected to the first bit line BL1.

Data may be stored in each of the plurality of memory cells by adjusting a resistance value of the variable resistance element MTJ of each memory cell. For example, as illustrated in FIGS. 4 and 6, the variable resistance element MTJ may include a free layer FRL, a barrier layer BRL, and a fixed layer FXL. The barrier layer BRL may be interposed between the free layer FRL and the fixed layer FXL, the free layer FRL may be connected with the first bit line BL1, and the fixed layer FXL may be connected with the second end of the access transistor TR.

A magnetization direction of the fixed layer FXL may be fixed to a specific direction, and a magnetization direction of the free layer FRL may be changed according to a specific condition (e.g., a direction of a write current). According to some example embodiments, the variable resistance element MTJ may further include an anti-ferromagnetic layer for fixing the magnetization direction of the fixed layer FXL.

The free layer FRL may include a material which has a variable magnetization direction. The magnetization direction of the free layer FRL may be changed by an electrical/magnetic factor provided from outside and/or inside of a memory cell. The free layer FRL may include a ferromagnetic material that contains at least one of cobalt (Co), iron (Fe), and nickel (Ni). For example, the free layer FRL may include at least one selected from FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and Y3Fe5O12. However, the present disclosure is not limited to these examples.

A thickness of the barrier layer BRL may be smaller than a spin diffusion distance. The barrier layer BRL may include a non-magnetic material. For example, the barrier layer BRL may include at least one selected from a group of magnesium (Mg), titanium (Ti), aluminum (Al), oxide of magnesium-zinc (MgZn) and magnesium-boron (MgB), and nitride of titanium (Ti) and vanadium (V). However, the present disclosure is not limited to these examples.

The fixed layer FXL may have a magnetization direction pinned by the anti-ferromagnetic layer. The fixed layer FXL may include a ferromagnetic material. For example, the fixed layer FXL may include at least one selected from a group of CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and Y3Fe5O12. According to some embodiments, the anti-ferromagnetic layer may include an anti-ferromagnetic material. For example, the anti-ferromagnetic layer may include at least one selected from a group of PtMn, IrMn, MnO, MnS, MnTe, MnF2, FeCl2, FeO, CoCl2, CoO, NiCl2, NiO, and Cr. However, the present disclosure is not limited to these examples.

As illustrated in FIG. 4, the magnetization direction of the free layer FRL may be changed according to a direction of a write current WC1 or WC2 flowing through the variable resistance element MTJ. For example, referring to the first write current WC1 illustrated in FIG. 4, when a current flows in a direction from the first source line SL1 to the first bit line BL1, the magnetization direction of the free layer FRL may be opposite to the magnetization direction of the fixed layer FXL, which corresponds to an anti-parallel state. Referring to the second write current WC2 illustrated in FIG. 4, when a current flows in a direction from the first bit line BL1 to the first source line SL1, the magnetization direction of the free layer FRL may be the same as the magnetization direction of the fixed layer FXL, which corresponds to a parallel state.

With reference to FIG. 5, described in greater detail below, in the case where the variable resistance element MTJ is in the anti-parallel state, the variable resistance element MTJ may have an anti-parallel resistance value R1 (also referred to as a half-balance resistance). In the case where the variable resistance element MTJ is in the parallel state, the variable resistance element MTJ may have a parallel resistance value R0 (also referred to as a balance resistance). That is, data may be stored in the memory cell MC depending on a resistance value of the variable resistance element MTJ, and the data stored in the memory cell MC may be read by determining the resistance value of the variable resistance element MTJ.

When the variable resistance element MTJ is in a half-equilibrium state, the variable resistance element MTJ may have a half-balance resistance R1 as shown in FIG. 5. When the variable resistance element MTJ is in a balanced state, the variable resistance element MTJ may have a balance resistance R0. The memory device 1100 may distinguish data 0 or data 1 using the size of the resistance value.

The memory device 1100 may perform a read operation through comparison with a reference resistance Rref having an intermediate level between data 0 and data 1. The reference resistance Rref may be externally changed without using a fixed value when the memory device 1100 is manufactured. For example, the reference resistance may be determined through a test operation. Data may be stored in the memory cell MC according to the resistance value of the variable resistance element MTJ. Data stored in the memory cell MC may be read by reading the resistance value of the variable resistance element MTJ.

Referring to FIG. 6, the access transistor TR may include a body substrate 111, a gate electrode 112, and junctions 113 and 114. The junction 113 may be formed on the body substrate 111 and may be connected with the first source line SL1. The junction 114 may be formed on the body substrate 111 and may be connected with the first bit line BL1 through the MTJ element. The gate electrode 112 may be formed on the body substrate 111 between the junctions 113 and 114 and may be connected with the first word line WL1.

Figure 7:
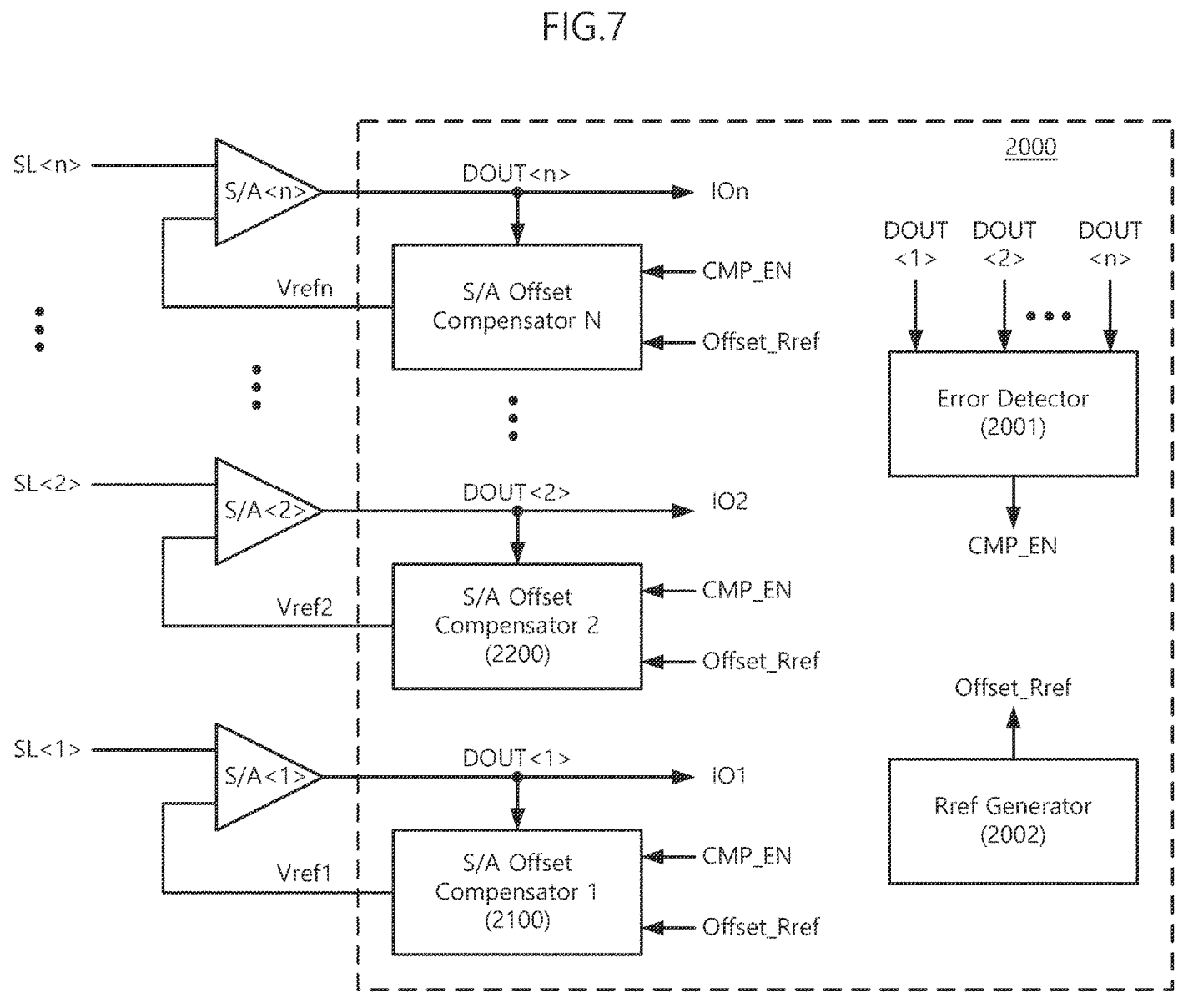

FIG. 7 is a block diagram illustrating an example of the read offset compensator 2000 shown in FIG. 2, according to an example embodiment. Referring to FIG. 7, the read offset compensator 2000 may include an error detector 2001, an offset reference resistance (Rref) generator 2002, and first to N-th sense amplifier (S/A) offset compensators (e.g., S/A Offset Compensator 1 to S/A Offset Compensator N).

The read offset compensator 2000 may provide first to n-th reference voltages Vref1 to Vrefn to the first to n-th sense amplifiers S/A<i> (i=1 to n), respectively. The read offset compensator 2000 may receive the first to n-th output data DOUT<i> (i=1 to n) from the first to n-th sense amplifiers S/A<i> (i=1 to n), respectively, and adjust the first to n-th reference voltages Vref1 to Vrefn.

The error detector 2001 may receive first to n-th output data DOUT<i> (i=1 to n) from the first to n-th sense amplifiers S/A<i> (i=1 to n), respectively, and generate a compensation enable signal CMP_EN. The compensation enable signal CMP_EN may be provided to the first to n-th sense amplifier offset compensators. The error detector 2001 may activate the compensation enable signal CMP_EN when the number of error bits of output data is greater than a threshold value. For example, the error detector 2001 may activate the compensation enable signal CMP_EN to a high level when the number of error bits of output data is 2 or more.

The offset reference resistance generator 2002 may generate an offset reference resistance Offset_Rref. The offset reference resistance Offset_Rref may be externally changed without using a fixed value when the memory device 1100 is manufactured. The offset reference resistance Offset_Rref may be determined through a test operation. The offset reference resistance generator 2002 may provide the offset reference resistance Offset_Rref to the first through N-th sense amplifier offset compensators.

The first sense amplifier (S/A) offset compensator (S/A Offset Compensator 1) 2100 may receive first output data DOUT<1> from the first sense amplifier S/A<1>. The first sense amplifier offset compensator 2100 may compare the first output data DOUT<1> with expected data EXP_DATA (see FIG. 9) in response to the compensation enable signal CMP_EN of the error detector 2001. The expected data EXP_DATA may be stored in the first sense amplifier offset compensator 2100. The first sense amplifier offset compensator 2100 may increase or decrease the count value according to the comparison result. The first sense amplifier offset compensator 2100 may adjust the offset reference resistance (Offset_Rref). For example, the first sense amplifier offset compensator 2100 may adjust the offset reference resistance using the count value.

The second sense amplifier (S/A) offset compensator (S/A Offset Compensator 2) 2100 may receive the second output data DOUT<2> from the second sense amplifier S/A<2> to increase or decrease a count value in response to the compensation enable signal CMP_EN. The second sense amplifier offset compensator 2200 may adjust the second reference voltage Vref2 by adjusting the offset reference resistance (Offset_Rref) using the count value. The N-th sense amplifier (S/A) offset compensator (S/A Offset Compensator N) may receive the n-th output data DOUT<n> from the n-th sense amplifier S/A<n> and adjust the n-th reference voltage Vrefn by adjusting the offset reference resistance (Offset_Rref).

FIG. 8 is a block diagram illustrating an example of the first sense amplifier (S/A) offset compensator (S/A Offset Compensator 1 2100 shown in FIG. 7, according to an example embodiment. Referring to FIG. 8, the first sense amplifier (S/A) offset compensator (S/A Offset Compensator 1) 2100 may include a decision logic 2110, an up/down counter 2120, an adder 2130, and an offset reference resistance (Rref) regulator 2140.

The first sense amplifier (S/A) offset compensator (S/A Offset Compensator 1 2100 may receive the first output data DOUT<1> from the first sense amplifier S/A<1>. The first sense amplifier offset compensator 2100 may increase or decrease a count value in response to the compensation enable signal CMP_EN. The first sense amplifier offset compensator 2100 may adjust the first reference voltage Vref1 by adjusting the offset reference resistance (Offset_Rref) using the count value.

The decision logic 2110 may receive the first output data DOUT<1> from the first sense amplifier S/A<1>. The decision logic 2110 may compare the first output data DOUT<1> with expected data EXP_DATA (see FIG. 9) stored therein in response to the compensation enable signal CMP_EN of the error detector 2001, and generate a count increase signal CNT_INC. The count increase signal CNT_INC may be provided to the up/down counter 2120.

The up/down counter 2120 may receive the count increase signal CNT_INC from the decision logic 2110 and generate a count up signal CNT_UP or a count down signal CNT_DN. The count up signal CNT_UP is a signal for increasing the offset reference resistance Offset_Rref by a local resistance Lref. The local resistance Lref may be predetermined. The count down signal CNT_DN is a signal for decreasing the offset reference resistance Offset_Rref by the local resistance Lref.

The adder 2130 may receive the offset reference resistance Offset_Rref from the offset reference resistance (Rref) generator 2002. The adder 2130 may generate a reference resistance increase signal for increasing the offset reference resistance Offset_Rref by the local resistance Lref. The adder 2130 may receive the count down signal from the up/down counter 2120 and generate a reference resistance decrease signal for decreasing the offset reference resistance Offset_Rref by the local resistance Lref.

The offset reference resistance (Rref) regulator 2140 may receive the reference resistance increase signal or the reference resistance decrease signal from the adder 2130 and adjust the offset reference resistance (Offest_Rref). For example, in some example embodiments, the offset reference resistance (Rref) regulator 2140 may receive the offset reference resistance (Offest_Rref) from the adder 2130. In some example embodiments, the offset reference resistance (Rref) regulator 2140 may receive the offset reference resistance (Offest_Rref) directly from the offset reference resistance (Rref) generator 2002. The offset reference resistance regulator 2140 may control the first reference voltage Vref1 by adjusting the offset reference resistance (Offset_Rref). The first reference voltage Vref1 may be provided to the first sense amplifier S/A<1>.

Figure 9:
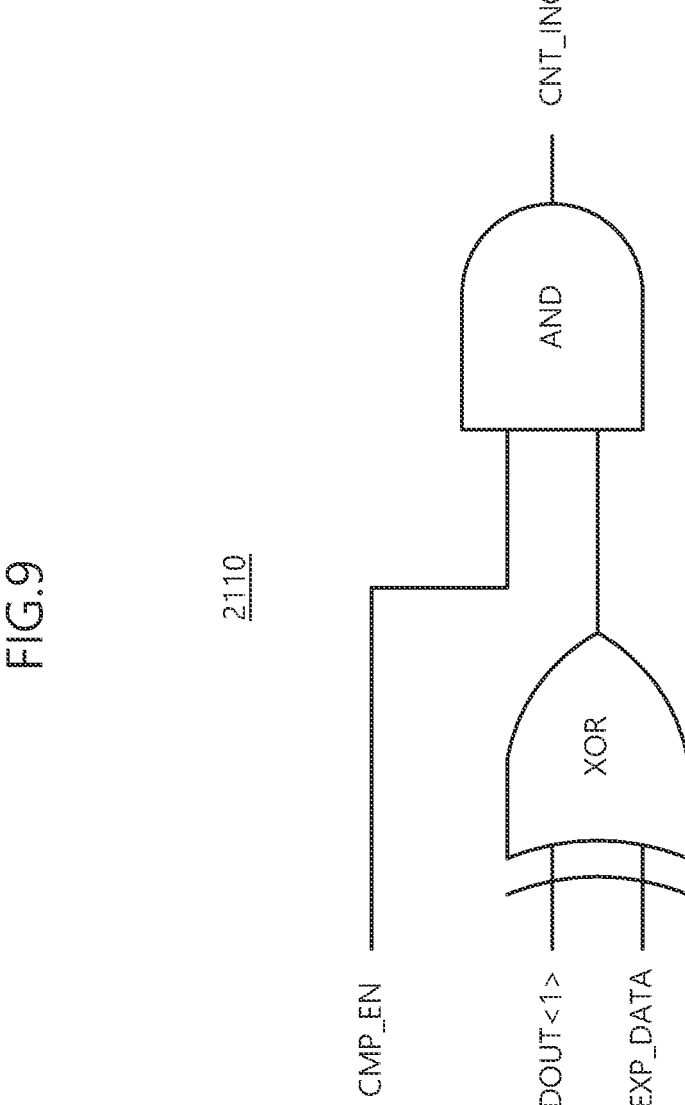
FIG. 9 is a circuit diagram illustrating a decision logic of the first sense amplifier offset compensator shown in FIG. 8, according to an example embodiment.

FIG. 9 is a circuit diagram illustrating an example of the decision logic 2110 shown in FIG. 8, according to an example embodiment. Referring to FIG. 9, the decision logic 2110 may perform an XOR logic operation and an AND logic operation.

For example, the decision logic 2110 may include an XOR gate and an AND gate. The XOR gate may receive the first output data DOUT<1> and the expected data EXP_DATA, and perform an XOR logic operation. The AND gate may receive an output signal of the XOR gate and the compensation enable signal CMP_EN, and perform an AND logic operation. The AND gate may output a count increase signal CNT_INC.

FIG. 10 is a diagram for explaining a logical operation result of the decision logic 2110 shown in FIG. 9, according to an example embodiment. Referring to FIG. 10, when the compensation enable signal CMP_EN is logical 0, the count increase signal CNT_INC is always logical 0 regardless of the logical values of the output data DOUT<i> and the expected data EXP_DATA.

When the compensation enable signal CMP_EN is logic 1, the count increase signal CNT_INC is logic 0 or logic 1 according to the logic values of the output data DOUT<i> and the expected data EXP_DATA. For example, if the logic values of the output data DOUT<i> and the expected data EXP_DATA are the same, the count increase signal CNT_INC is logic 0. If the logic values of the output data DOUT<i> and the expected data EXP_DATA are different, the count increase signal CNT_INC is logic 1.

In the example of FIG. 8, the decision logic 2110 may receive the first output data DOUT<1> and compare the first output data DOUT<1> with the expected data EXP_DATA. The decision logic 2110 may generate the count increase signal CNT_INC if the first output data DOUT<1> is different from the expected data EXP_DATA, when the compensation enable signal CMP_EN is activated.

Figure 11:
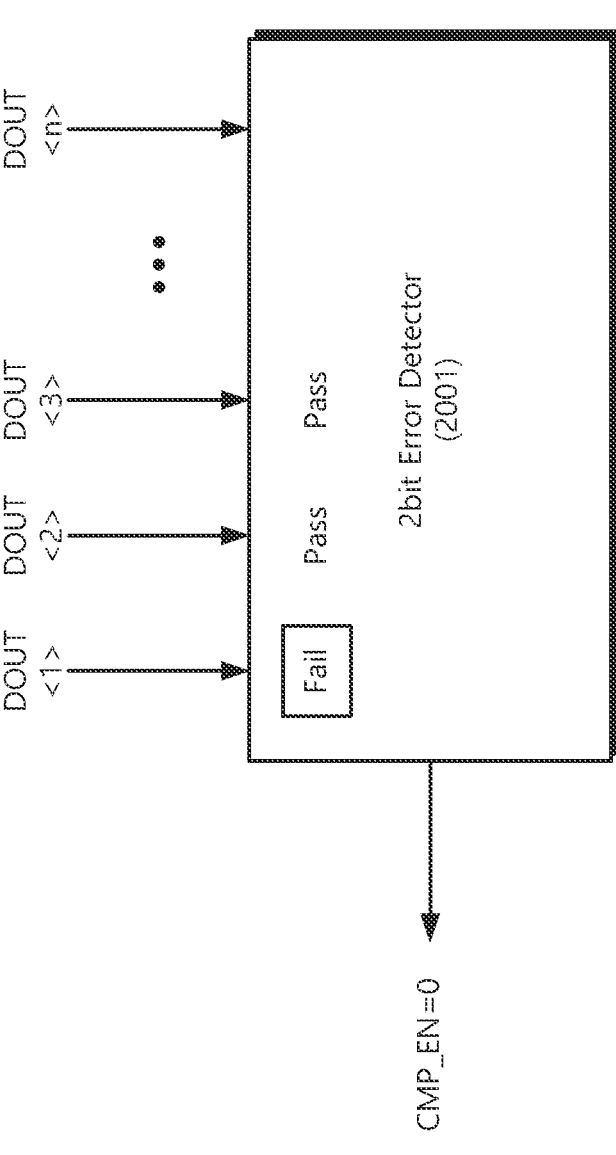
Figure 12:
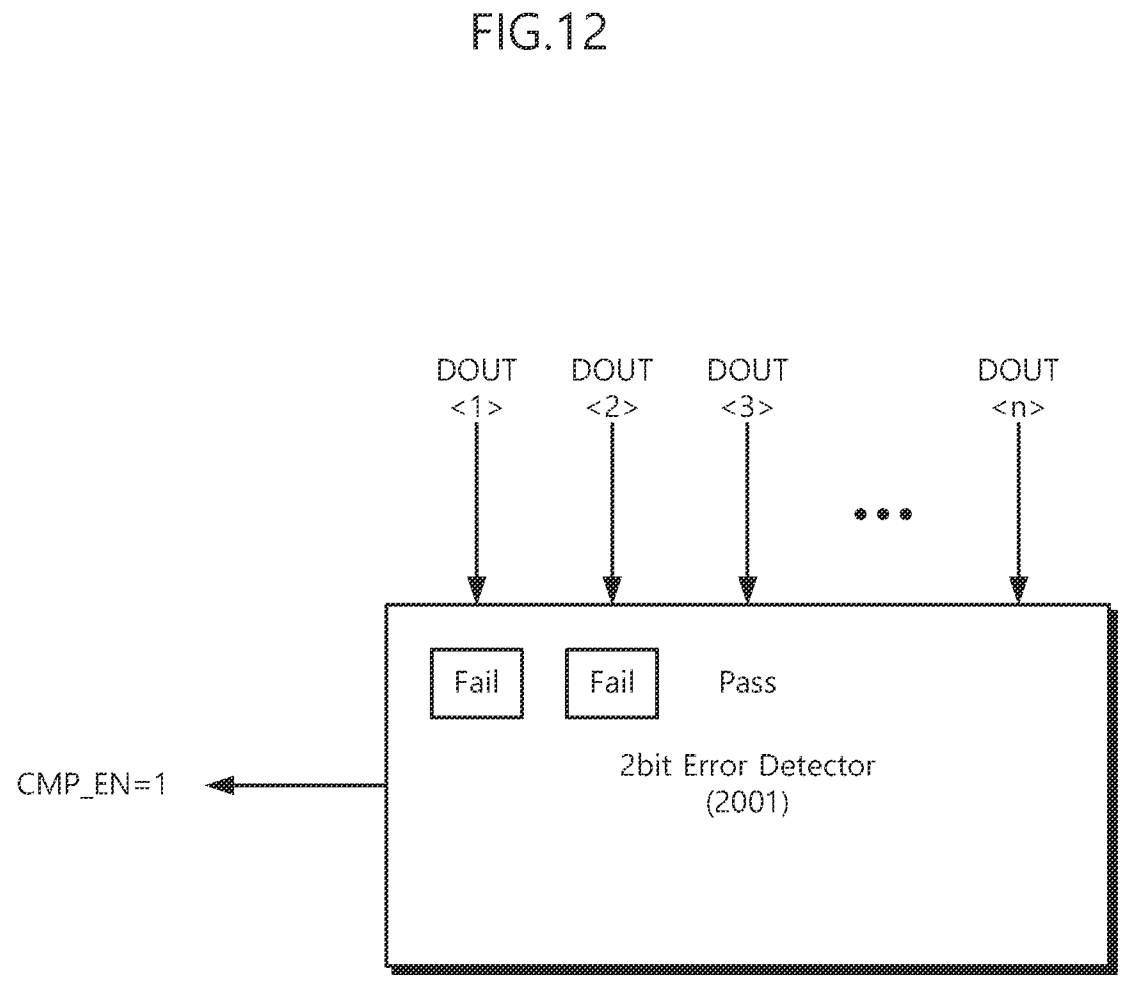

FIGS. 11 and 12 are block diagrams illustrating the error detector 2001 shown in FIG. 8, according to some example embodiments. FIGS. 11 and 12 illustrate an example in which the error detect 2001 is a 2-bit error detector, according to some example embodiments. The error detector 2001 may receive the first through n-th output data, and detect whether there is an error of 2 bits or more. The error detector 2001 may activate the compensation enable signal CMP_EN when errors of 2 bit or more are detected.

Referring to FIG. 11, the first output data DOUT<1> is 'Fail'. All of the second to n-th output data are 'Pass'. The error detector 2001 does not activate the compensation enable signal CMP_EN since errors of 2 bit or more are not detected. That is, the compensation enable signal CMP_EN has logic 0.

Referring to FIG. 12, the first and second output data DOUT<1> and DOUT<2> are 'Fail'. The third to n-th output data are "Pass". The error detector 2001 may activate the compensation enable signal CMP_EN since errors of 2 bit or more are detected. That is, the compensation enable signal CMP_EN has logic 1.

Figure 13:
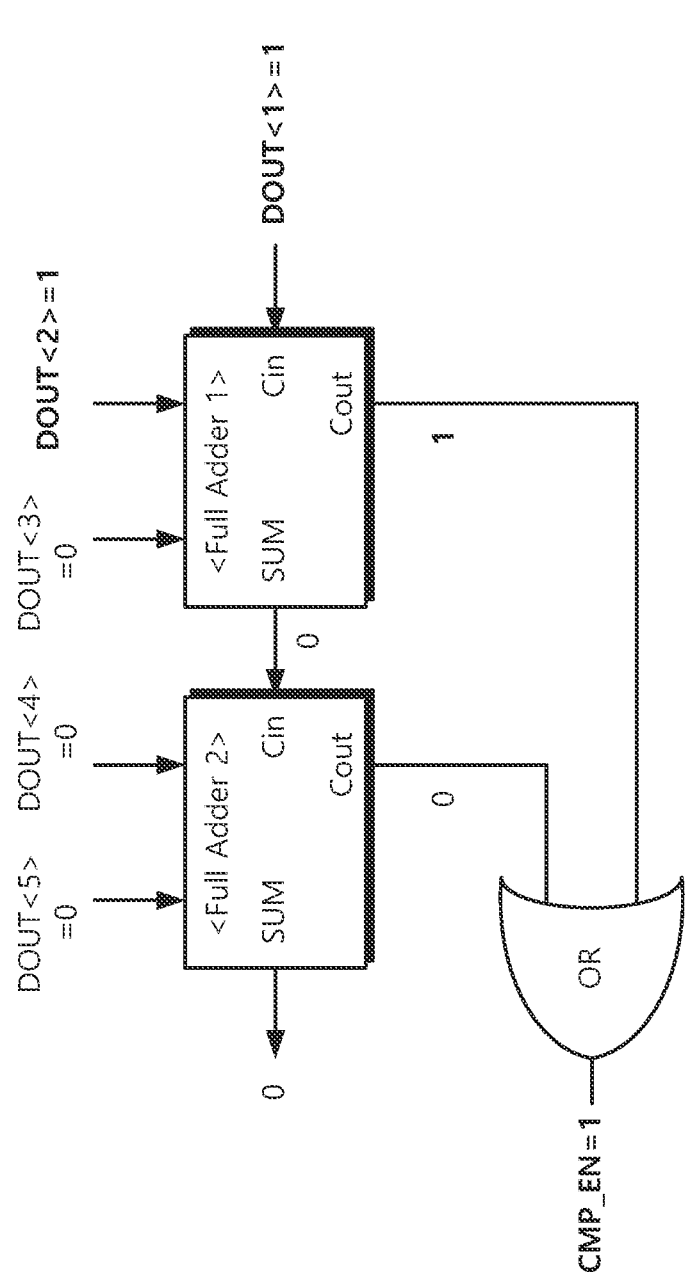
Figure 15:
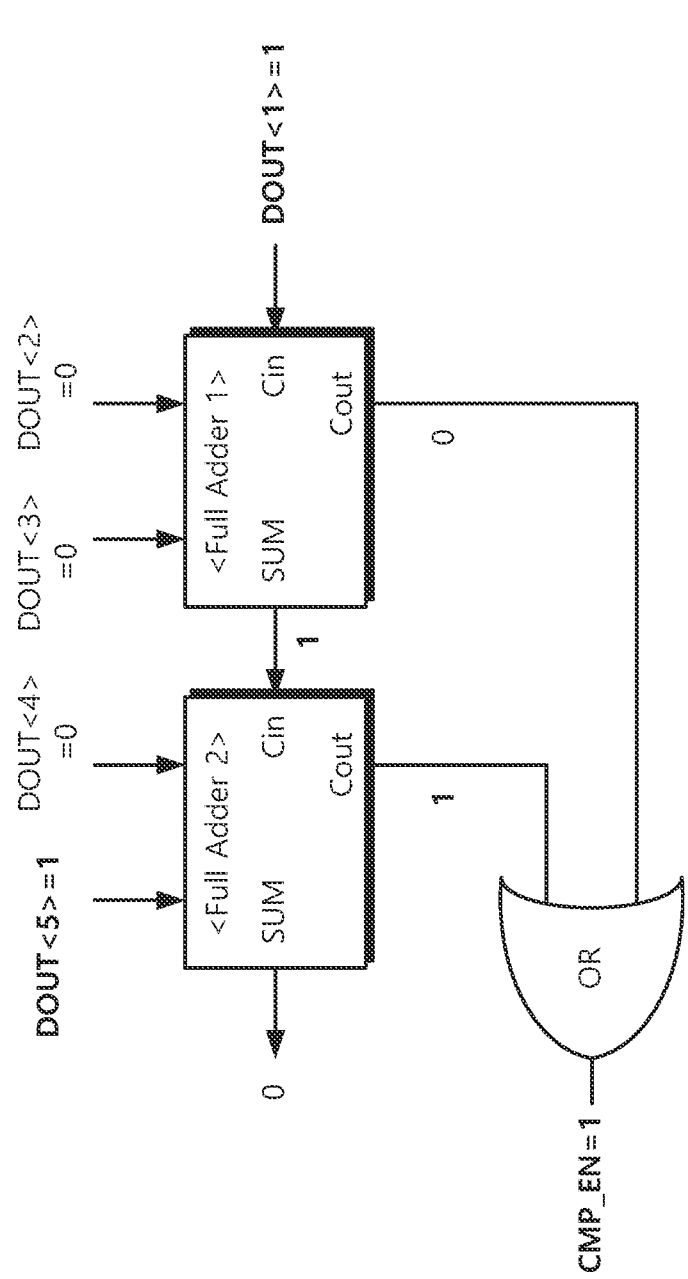

FIGS. 13 to 15 are circuit diagrams and charts illustrating an example in which the error detector 2001 shown in FIG. 12 detects a 2-bit error, according to some example embodiments. The error detector 2001 may receive first through N-th output data and generate the compensation enable signal CMP_EN. This example assumes that data 0 is stored in all memory cells and the expected data EXP_DATA is 0.

The error detector 2001 may include a first full adder (Full Adder 1), a second full adder (Full Adder 2), and an OR gate. The first full adder (Full Adder 1) may receive the first output data DOUT<1> through the carry input terminal Cin and receive the second output data DOUT<2> and the third output data DOUT<3> through the data input terminals. The first full adder may provide the sum of the second output data DOUT<2> and the third output data DOUT<3> to the carry input terminal Cin of the second full adder. The first full adder may provide the carry value to the OR gate through the carry output terminal Cout.

The second full adder (Full Adder 2) may receive fourth output data DOUT<4> and fifth output data DOUT<5> through data input terminals. The second full adder may calculate sum of the output of the first full adder, the fourth output data DOUT<4>, and the fifth output data DOUT<5>. The second full adder may provide the carry value to the OR gate through the carry output terminal Cout.

FIG. 13 illustrates an example in which the first output data DOUT<1> and second output data DOUT<2> are 'Fail'. Referring to FIGS. 13 and 14, when the first output data DOUT<1> and second output data DOUT<2> are 1 and the third output data DOUT<3> is 0, the first full adder may output data 1 through the carry output terminal Cout. The data sum SUM of the first full adder is data 0, and may be provided to the carry input terminal Cin of the second full adder.

When the fourth output data DOUT<4> and the fifth output data DOUT<5> are each 0 and data 0 is received through the carry input terminal Cin, the data sum SUM of the second full adder is data 0. The second full adder may output data 0 through the carry output terminal Cout. The OR gate may receive data 1 from the first full adder and data 0 from the second full adder, and activate the compensation enable signal CMP_EN.

FIG. 15 illustrates an example in which the first output data DOUT<1> and the fifth output data DOUT<5> are 'Fail'. Referring to FIG. 15, when the first output data DOUT<1> is 1 and the second output data DOUT<2> and the third output data DOUT<3> are 0, the first full adder may output data 0 through the carry output terminal Cout. The data sum SUM of the first full adder is data 1, and may be provided to the carry input terminal Cin of the second full adder.

When the fourth output data DOUT<4> is 0 and the fifth output data DOUT<5> is 1 and data 1 is received through the carry input terminal Cin, the data sum SUM of the second full adder is data 0. The second full adder may output data 1 through the carry output terminal Cout. The OR gate may receive data 0 from the first full adder and data 1 from the second full adder, and activate the compensation enable signal CMP_EN.

The error detector 2001 illustrated in FIG. 12 may activate the compensation enable signal CMP_EN when at least two of the first to n-th output data are different from the expected data EXP_DATA.

Figure 16:
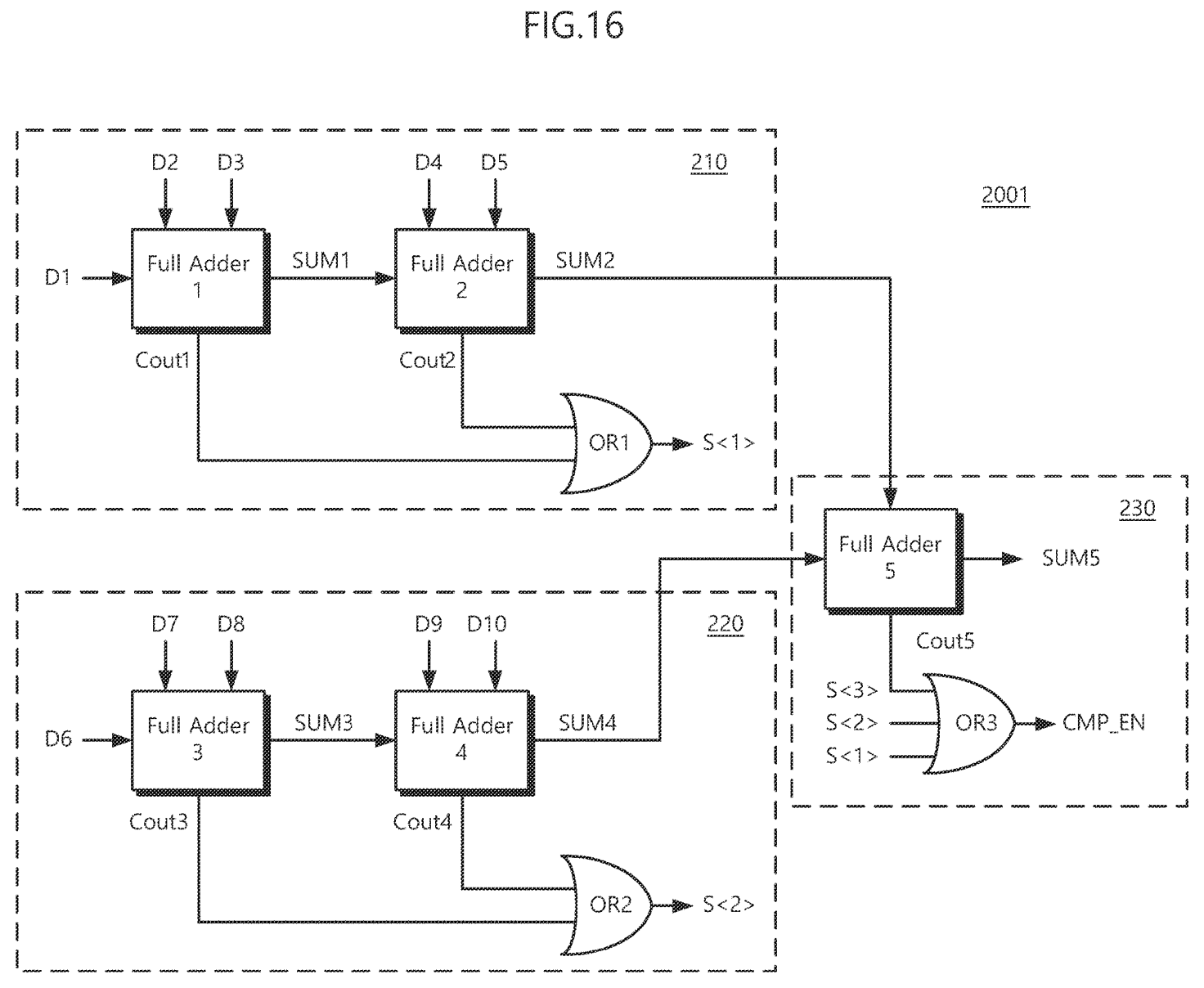

FIG. 16 is a circuit diagram illustrating an example in which the error detector 2001 shown in FIG. 8 receives first to tenth output data, according to an example embodiment. Referring to FIG. 16, the error detector 2001 may include a first error detector 210, a second error detector 220, and a third error detector 230. The first and second error detectors 210 and 220 may detect a 2-bit error as described in FIGS. 13 to 15.

The first error detector 210 may include a first full adder (Full Adder 1) and a second full adder (Full Adder 2) and a first OR gate OR1. The first full adder (Full Adder 1) may receive first output data D1 through the carry input terminal and receive second output data D2 and third output data D3 through the data input terminals. The first full adder may output the first carry Cout1 through the carry output terminal and output the first sum SUM1 through the data output terminal.

The second full adder (Full Adder 2) may receive the first sum SUM1 through the carry input terminal and receive fourth output data D4 and fifth output data D5 through the data input terminals. The second full adder may output the second carry Cout2 through the carry output terminal and output the second sum SUM2 through the data output terminal. The first OR gate OR1 may receive the first and second carries Cout1 and Cout2 and output a first error detection signal S<1>.

The second error detector 220 may include a third full adder (Full Adder 3) and a fourth full adder (Full Adder 4) and a second OR gate OR2. The third full adder (Full Adder 3) may receive sixth output data D6 through the carry input terminal and receive seventh output data D7 and eighth output data D8 through the data input terminals. The third full adder may output the third carry Cout3 through the carry output terminal and output the third sum SUM3 through the data output terminal.

The fourth full adder (Full Adder 4) may receive the third sum SUM3 through the carry input terminal and receive ninth output data D9 and tenth output data D10 through the data input terminals. The fourth full adder may output the fourth carry Cout4 through the carry output terminal and output the fourth sum SUM4 through the data output terminal. The second OR gate OR2 may receive the third and fourth carries Cout3 and Cout4 and output a second error detection signal S<2>.

The third error detector 230 may include a fifth full adder (Full Adder 5) and a third OR gate OR3. The fifth full adder (Full Adder 5) may receive the second sum SUM2 of the first error detector 210 through the data input terminal and receive the fourth sum SUM4 of the second error detector 220 through the carry input terminal. The fifth full adder may output the fifth carry Cout5 through the carry output terminal and output the fifth sum SUM5 through the data output terminal. The fifth carry Cout5 may output the third error detection signal S<3>. The third OR gate OR3 may receive first to third error detection signals S<1>, S<2> and S<3>, and output a compensation enable signal CMP_EN.

The error detector 2001 shown in FIG. 16 may activate the first error detection signal S<1> when at least two error bits are detected among the first to fifth data D1 to D5. When at least two error bits are detected among the sixth to tenth data D6 to D10, the second error detection signal S<2> may be activated.

One error bit may be detected among the first to fifth data D1 to D5, and one error bit may be detected among the sixth to tenth data D6 to D10. In the example embodiment illustrated in FIG. 16, the error detector 2001 may activate the third error detection signal S<3>. The error detector 2001 illustrated in FIG. 16 may activate the compensation enable signal CMP_EN when at least two error bits are detected among the first to tenth data D1 to D10.

Figure 17:
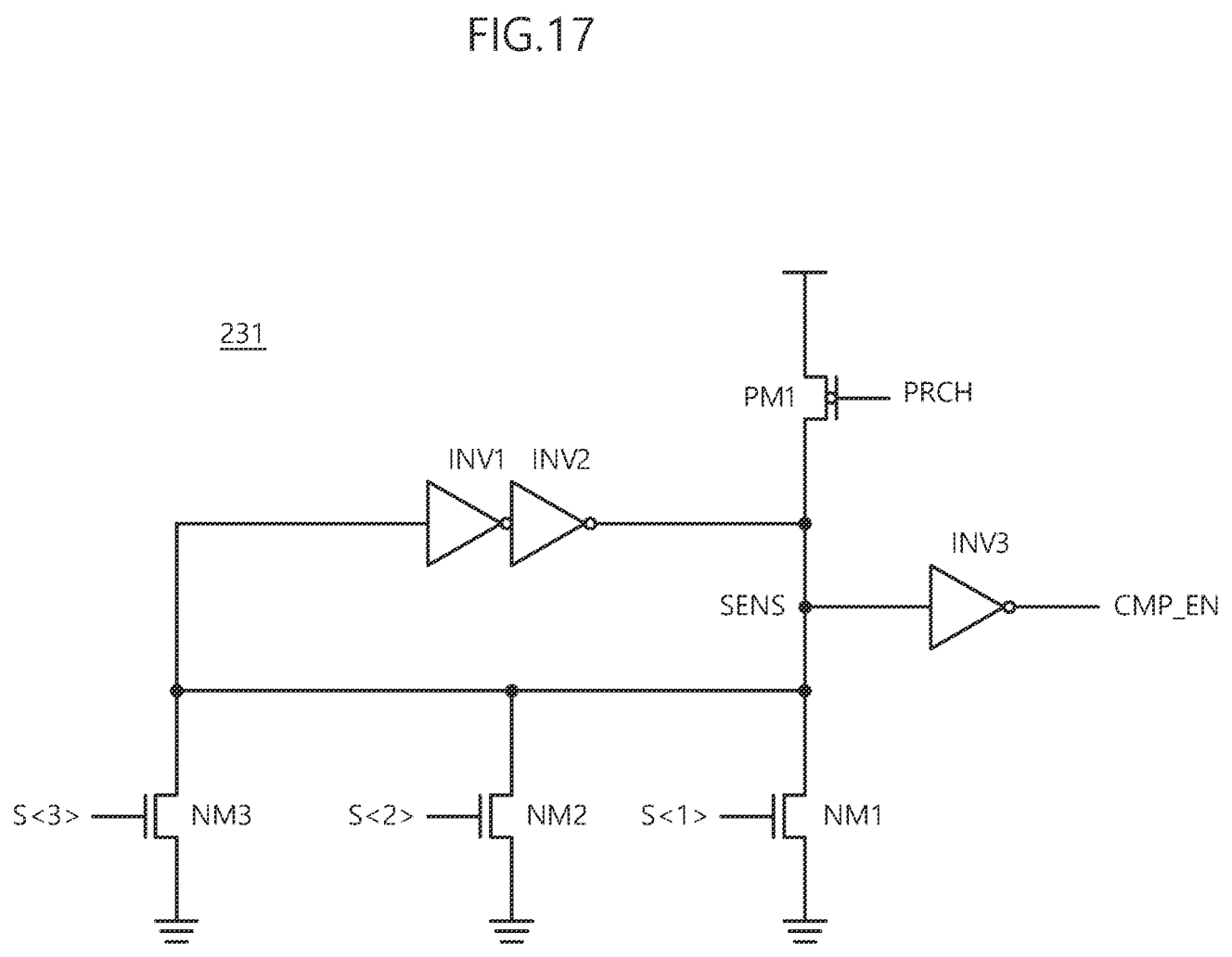

FIG. 17 is a circuit diagram illustrating an example of the third OR gate shown in FIG. 16, according to an example embodiment. The third error detector 230 may include a compensation enable signal generator 231 configured with dynamic logic instead of the third OR gate OR3.

Referring to FIG. 17, the compensation enable signal generator 231 may include a first PMOS transistor PM1, a first NMOS transistor NM1, a second NMOS transistor NM2, and a third NMOS transistor NM3, and a first inverter INV1, a second inverter INV2, and a third inverter INV3. The first PMOS transistor PM1 is connected between the power supply terminal and the sense node SENS and may be controlled by a pre-charge signal PRCH provided from the control logic 1160. The first to third NMOS transistors NM1 to NM3 are connected in parallel between the sense node SENS and the ground terminal, and may be controlled by the first to third error detection signals S<1>, S<2>, and S<3>, respectively.

The first and second inverters INV1 and INV2 may be connected to the sense node SENS, and the third inverter INV3 may be connected between the sense node SENS and an output terminal. The compensation enable signal generator 231 may output the compensation enable signal CMP_EN through the output terminal. When any one of the first to third error detection signals is activated, the sense node SENS may be discharged through the ground terminal. Accordingly, the compensation enable signal generator 231 may activate the compensation enable signal CMP_EN.

In FIG. 16, when the number of first and second error detectors 210 and 220 increases, the size of the third OR gate OR3 may increase. Since the compensation enable signal generator 231 shown in FIG. 17 may receive the first to third error detection signals using NMOS transistors, the chip size may be reduced.

FIG. 18 is a graph for explaining offset reference resistance generated by the offset reference resistance (Rref) generator 2002 shown in FIG. 8, according to an example embodiment. Referring to FIGS. 8 and 18, the offset reference resistance Offset_Rref is different from a general reference resistance Rref (see FIG. 5) for distinguishing data 0 from data 1 during a read operation. The offset reference resistance Offset_Rref is a resistance for adjusting resistance distribution of the memory device 1100 to be varied due to a mismatch between the MTJ resistance, Rref, and S/A resistance, as shown in FIG. 18.

The count up signal is a signal for increasing the offset reference resistance Offset_Rref by a local resistance Lref. The local resistance Lref may be predetermined. The count down signal is a signal for decreasing the offset reference resistance Offset_Rref by the local resistance Lref. The offset reference resistance Offset_Rref may increase by an integer multiple of the local resistance Lref according to the count up signal.

When the resistance distribution moves from R0 to R1, the offset reference resistance Offset_Rref may increase by Lref1. When the resistance distribution moves from R0 to R2, the offset reference resistance Offset_Rref may increase by Lref2.

FIG. 19 is a graph for explaining a read margin before and after compensating for an offset reference resistance, according to an example embodiment. In FIG. 19, M1 is a read margin before compensating for the offset reference resistance, and M2 is a read margin after compensating for the offset reference resistance. Referring to FIG. 19, the read margin may be improved by M2-M1 after compensating for the offset reference resistance.

During a read operation, the memory device 1100 may perform a read operation on data 0 and data 1 centered on the reference resistance Rref. If a resistance distribution is changed from Rp to Rp+ due to a mismatch of the MTJ resistance or the S/A resistance, the read margin of the memory device 1100 may be reduced to M1.

The memory device 1100 may compensate the reference resistance Rref as much as the local resistance Lref1 calculated during the offset reference resistance compensation operation described above. Thus, the reference resistance is changed from Rref to Rref+Lref1, and Rap is changed to Rap+. Since the memory device 1100 is individually calibrated to have a local resistance for each sense amplifier, a read margin may have M2 during a read operation.

FIG. 20 is a flowchart illustrating an offset reference resistance compensating operation of a memory device according to an example embodiment. Referring to FIG. 20, the memory device 1100 may write the same data to all memory cells (S110). For example, the memory device 1100 may write data 0 to all memory cells.

The memory device 1100 may perform a read operation on all memory cells (S120). The memory device 1100 may read output data DOUT<n:1>. The memory device 1100 may detect error bits of output data (S130). The expected data may be 0. During a read operation, when output data is not 0, the memory device 1100 may be treated as a 'Fail'.

The memory device 1100 may determine whether the number of error bits of output data is greater than a threshold value (S140). The error detector 2001 may activate the compensation enable signal CMP_EN when the number of error bits of output data is greater than the threshold value. For example, the error detector 2001 may activate the compensation enable signal CMP_EN to a high level when the number of error bits of output data is 2 or more.

When the number of error bits of the output data is greater than the threshold value (S140, YES), the memory device 1100 may compensate for the offset reference resistance (S150). Each sense amplifier offset compensator (e.g., 2100)

may receive the first output data DOUT<1> from the first sense amplifier S/A<1>. The first sense amplifier offset compensator 2100 may compare the first output data DOUT<1> with expected data EXP_DATA stored therein in response to the compensation enable signal CMP_EN of the error detector 2001. The first sense amplifier offset compensator 2100 may increase the count value according to the comparison result. The first sense amplifier offset compensator 2100 may compensate for the offset reference resistance using the count value. The first sense amplifier offset compensator 2100 may adjust the first reference voltage Vref1 by compensating for the offset reference resistance.

The memory device 1100 may determine whether output data is the final output data (S160). If the output data is the final output data, the operation ends. If the output data is not the final output data, an offset reference resistance compensation operation for the next output data may be performed (S145). In step S140, if the number of error bits is less than or equal to the threshold value (S140, NO), the memory device 1100 may perform an offset reference resistance compensation operation for the next output data.

According to various example embodiments, the memory device may write the same data to all memory cells, read output data, determine whether the number of error bits is greater than a threshold value, and perform an offset reference resistance compensation operation according to the determination result. A read margin may be improved during a read operation through an offset reference resistance compensation operation. While various example embodiments have been described with reference to the drawings, it will be apparent to those of ordinary skill in the art that various changes and modifications may be made thereto without departing from the spirit and scope of the present disclosure as set forth in the following claims.

What is claimed is:

1. A memory device comprising:
   a memory cell array comprising a plurality of memory cells;
   a row decoder connected to the memory cell array through word lines;
   a column decoder connected to the memory cell array through bit lines and source lines;
   a sense amplifier configured to read data stored in a memory cell by detecting a difference between a source line voltage and a reference voltage during a read operation; and
   a control logic comprising a read offset compensator that receives output data from the sense amplifier and performs an offset reference resistance compensation operation,
   wherein the read offset compensator compares a number of error bits of the output data with a threshold value, performs the offset reference resistance compensation operation based on a result of the comparison, calculates a local resistance for compensating an offset reference resistance for the sense amplifier during the offset reference resistance compensation operation, and adjusts a reference resistance for the sense amplifier based on the local resistance during the read operation,
   wherein the sense amplifier includes a plurality of sense amplifiers; and
   wherein the read offset compensator includes:
   an error detector configured to determine whether the number of error bits of the output data from the plurality of sense amplifiers is greater than the threshold value and output a compensation enable signal based on a result of the determination;

an offset reference resistance generator configured to generate an offset reference resistance for each of the plurality of sense amplifiers; and a plurality of sense amplifier offset compensators corresponding respectively to the plurality of sense amplifiers, each of the plurality of sense amplifier offset compensators configured to receive output data from a corresponding one of the plurality of sense amplifiers, compare the output data with expected data, and adjust the offset reference resistance for the corresponding one of the plurality of sense amplifiers based on a result of the comparison.

2. The memory device of claim 1, wherein the read offset compensator comprises:

an error detector configured to determine whether the number of error bits of the output data from the sense amplifier is greater than the threshold value and output a compensation enable signal based on a result of the determination;

a decision logic configured to compare the output data of the sense amplifier with expected data based on the compensation enable signal and generate a count increase signal when the output data and the expected data are different; and an up/down counter configured to increase the offset reference resistance by the local resistance based on the count increase signal.

3. The memory device of claim 2, wherein the read offset compensator further comprises:

an offset reference resistance generator configured to generate the offset reference resistance;

an adder configured to generate a reference resistance increase signal for increasing the offset reference resistance by the local resistance; and an offset reference resistance regulator configured to receive the reference resistance increase signal from the adder and adjust the offset reference resistance.

4. The memory device of claim 3, wherein the offset reference resistance regulator adjusts the offset reference resistance to generate an adjusted reference voltage and provides the adjusted reference voltage to the sense amplifier.

5. The memory device of claim 1, wherein the plurality of memory cells of the memory cell array are written with the same data before the offset reference resistance compensation operation.

6. The memory device of claim 1, wherein each of the plurality of sense amplifier offset compensators includes:

a decision logic configured to compare the output data and the expected data based on the compensation enable signal, and generate a count increase signal when the output data and the expected data are different;

an up/down counter configured to increase the offset reference resistance by the local resistance for the sense amplifier that corresponds to the sense amplifier offset compensator based on the count increase signal;

an adder configured to receive the offset reference resistance and generate the reference resistance increase signal for adding the offset reference resistance and the local resistance; and an offset reference resistance regulator configured to receive the reference resistance increase signal from the adder and adjust the offset reference resistance based on the reference resistance increase signal.

7. The memory device of claim 6, wherein the offset reference resistance regulator adjusts the offset reference resistance to generate an adjusted reference voltage for the sense amplifier that corresponds to the sense amplifier offset compensator and provides the adjusted reference voltage to the sense amplifier.

8. The memory device of claim 6, wherein the decision logic includes:

a first logic gate configured to receive the output data and the expected data and perform an XOR operation; and a second logic gate configured to receive the compensation enable signal and an output signal of the first logic gate, and perform an AND operation on the compensation enable signal and the output signal to generate the count increase signal.

9. The memory device of claim 1, wherein the error detector includes a first full adder and a second full adder, and outputs the compensation enable signal by performing an OR operation on carry output terminals of the first full adder and the second full adder.

10. A read offset compensator of a memory device, the read offset compensator comprising:

an error detector configured to determine whether a number of error bits of output data input from a plurality of sense amplifiers of the memory device is greater than a threshold value and output a compensation enable signal based on a result of the determination;

an offset reference resistance generator configured to generate an offset reference resistance; and a plurality of sense amplifier offset compensators corresponding respectively to the plurality of sense amplifiers, each of the plurality of sense amplifier offset compensators configured to receive output data from a corresponding one of the plurality of sense amplifiers, compare the output data with expected data, and adjust the offset reference resistance for the sense amplifier based on a result of the comparison;

wherein each of the plurality of sense amplifier offset compensators calculates a local resistance for compensating the offset reference resistance for a corresponding one of the plurality of sense amplifiers during an offset reference resistance compensation operation, and, during a read operation, adjusts a reference resistance for the corresponding one of the plurality of sense amplifiers based on the local resistance for the corresponding one of the plurality of sense amplifiers.

11. The read offset compensator of claim 10, wherein each of the plurality of sense amplifier offset compensators comprises:

a decision logic configured to compare the output data and the expected data based on the compensation enable signal, and generate a count increase signal when the output data and the expected data are different;

an up/down counter configured to increase the offset reference resistance by the local resistance based on the count increase signal;

an adder configured to receive the offset reference resistance and generate a reference resistance increase signal for adding the offset reference resistance and the local resistance; and an offset reference resistance regulator configured to receive the reference resistance increase signal from the adder and adjust the offset reference resistance based on the reference resistance increase signal.

12. The read offset compensator of claim 11, wherein the offset reference resistance regulator adjusts the offset reference resistance to generate an adjusted reference voltage and provides the adjusted reference voltage to the corresponding one of the plurality of sense amplifiers.

13. The read offset compensator of claim 11, wherein the decision logic includes:

a first logic gate configured to receive the output data and the expected data and perform an XOR operation; and a second logic gate configured to receive the compensation enable signal and an output signal of the first logic gate, perform an AND operation on the compensation enable signal and the output signal to generate the count increase signal.

14. The read offset compensator of claim 10, wherein the error detector includes a first full adder and a second full adder, and outputs the compensation enable signal by performing an OR operation on carry output terminals of the first full adder and the second full adder.

15. A method for compensating offset reference resistance of a memory device, the method comprising:

writing a plurality of memory cells of the memory device with the same data;

reading output data of a plurality of sense amplifiers;

determining whether a number of error bits of the output data from the plurality of sense amplifiers is greater than a threshold value, and outputting a compensation enable signal based on a result of the determining; and calculating a local resistance for each of the plurality of sense amplifiers based on the compensation enable signal, and compensating for an offset reference resistance of each of the plurality of sense amplifiers using the local resistance corresponding to the sense amplifier, wherein, during a read operation, the memory device adjusts a reference resistance for each of the plurality of sense amplifiers based on the local resistance corresponding to the sense amplifier.

16. The method of claim 15, further comprising:

comparing output data of each of the plurality of sense amplifiers with corresponding expected data based on the compensation enable signal, and generating a count increase signal corresponding to the sense amplifier when the output data and expected data are different.

17. The method of claim 16, further comprising:

increasing the offset reference resistance corresponding to the sense amplifier by the local resistance based on the count increase signal.

18. The method of claim 17, further comprising:

adjusting the offset reference resistance corresponding to the sense amplifier to generate an adjusted reference voltage and providing the adjusted reference voltage to the sense amplifier.

19. The method of claim 15, wherein the plurality of memory cells of the memory device include an access transistor and a variable resistance element.

* * * * *